US009495920B2

(12) United States Patent
Yang

(10) Patent No.: US 9,495,920 B2
(45) Date of Patent: Nov. 15, 2016

(54) SHIFT REGISTER UNIT, GATE DRIVING APPARATUS AND DISPLAY DEVICE

(71) Applicant: BOE TECHNOLOGY GROUP CO., LTD., Beijing (CN)

(72) Inventor: Fei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 89 days.

(21) Appl. No.: 14/361,476

(22) PCT Filed: May 14, 2013

(86) PCT No.: PCT/CN2013/075595
§ 371 (c)(1),
(2) Date: May 29, 2014

(87) PCT Pub. No.: WO2014/153814
PCT Pub. Date: Oct. 2, 2014

(65) Prior Publication Data
US 2015/0317936 A1 Nov. 5, 2015

(30) Foreign Application Priority Data
Mar. 29, 2013 (CN) .......................... 2013 1 0108269

(51) Int. Cl.
G09G 3/36 (2006.01)
G11C 19/28 (2006.01)

(52) U.S. Cl.
CPC .............. G09G 3/36 (2013.01); G09G 3/3677 (2013.01); G11C 19/28 (2013.01); G09G 2310/0286 (2013.01)

(58) Field of Classification Search
CPC .............. G09G 2310/0283; G09G 2310/0286; G11C 19/28; G11C 19/282; G11C 19/285; G11C 19/287
See application file for complete search history.

(56) References Cited

U.S. PATENT DOCUMENTS 6,064,713 A * 5/2000 Lebrun ................ G09G 3/3677 377/67
2003/0227433 A1* 12/2003 Moon .................. G09G 3/3677 345/100

(Continued)

FOREIGN PATENT DOCUMENTS

CN 102629444 A 8/2012
CN 102831867 A 12/2012

OTHER PUBLICATIONS

International Preliminary Report on Patentability issued Sep. 29, 2015; PCT/CN2013/075595.

(Continued)

Primary Examiner — Quan-Zhen Wang
Assistant Examiner — Dong Hui Liang
(74) Attorney, Agent, or Firm — Ladas & Parry LLP

(57) ABSTRACT

A shift register unit, a gate driving apparatus and a display device are configured to solve the problem that a bi-directional scan function can not be realized in the prior art. The shift register unit includes: a driving module, which is configured, in a forward scan, to control a signal at a pull-up node to be at a first level when a forward selection signal is at the first level or is changed from the first level to a second level, and to control the signal at the pull-up node to be at the second level when a reverse selection signal is at the first level; and is configured, in a reverse scan, to control the signal at the pull-up node to be at the first level when the reverse selection signal is at the first level or is changed from the first level to the second level, and to control the signal at the pull-up node to be at the second level when the forward selection signal is at the first level; and an output module configured to output a received clock signal (CLK) under the control of the signal at the pull-up node.

16 Claims, 12 Drawing Sheets

(56) References Cited

U.S. PATENT DOCUMENTS

| | | |
|---|---|---|
| 2007/0217564 A1* | 9/2007 | Tobita ............... G11C 19/28 377/64 |
| 2007/0248204 A1* | 10/2007 | Tobita ............... G11C 19/28 377/64 |
| 2007/0274433 A1* | 11/2007 | Tobita ............. G09G 3/3677 377/64 |
| 2008/0219401 A1* | 9/2008 | Tobita ............. G09G 3/3677 377/79 |
| 2009/0167668 A1 | 7/2009 | Kim |
| 2011/0222645 A1* | 9/2011 | Tobita ............. G09G 3/3677 377/78 |
| 2013/0077736 A1* | 3/2013 | Son ................... G09G 3/20 377/69 |
| 2013/0088265 A1 | 4/2013 | Chen |
| 2014/0192039 A1* | 7/2014 | Wang ............... G11C 19/28 345/213 |

OTHER PUBLICATIONS

First Chinese Office Action Appln. No. 201310108269.7; Dated May 28, 2015.
International Search Report dated Jul. 12, 2013; PCT/CN2013/075595.

\* cited by examiner

US 9,495,920 B2

SHIFT REGISTER UNIT, GATE DRIVING APPARATUS AND DISPLAY DEVICE

TECHNICAL FIELD

The present disclosure relates to the field of display technique, and particularly to a shift register unit, a gate driving apparatus and a display device.

BACKGROUND

Liquid crystal displays (LCD) or organic light-emitting diode (OLED) displays have advantages such as a low radiation, a small volume, a low power consumption and the like, and thus replace conventional cathode ray tube (CRT) display gradually and are widely applied to information products such as notebook computers, personal digital assistants (PDA), flat-screen televisions, mobile phones or the like. In a conventional liquid crystal display, driving chips outside a liquid crystal panel are utilized to drive chips on the liquid crystal panel to display an image. In order to reduce the number of components and decrease the manufacture cost, in recent years, it is a trend that the driving circuit is manufactured on the liquid crystal panel directly; for example, the technique that integrates the gate driver into the liquid crystal panel (gate on array, GOA) is adopted.

A commonly-used shift register unit shown in FIG. 1 comprises a transistor T1, a transistor T2, a transistor T3, a capacitor C1 and a pull-down circuit 11. Assuming that the shift register unit shown in FIG. 1 is a $N^{th}$ stage of shift register unit, a gate of the transistor T1 receives an output signal of a $(N-1)^{th}$ stage of shift register unit, a source of the transistor T1 receives a signal VDD, and a drain of the transistor T1 is connected to a gate of the transistor T2; a source of the transistor T2 receives a clock signal CLK, and a drain of the transistor T2 serves as an output terminal of the $N^{th}$ stage of shift register unit; one terminal of the capacitor C1 is connected to the gate of the transistor T2, and the other terminal of the capacitor C1 is connected to the drain of the transistor T2; a source of the transistor T3 is connected to the gate of the transistor T2, a gate of the transistor T3 receives an output signal of the $(N+1)^{th}$ stage of shift register unit, and a drain of the transistor T3 receives a signal VSS; the pull-down circuit is connected to the gate of the transistor T2 and the drain of the transistor T2.

When the transistor T1 is turned on by the output signal from the $(N-1)^{th}$ stage of shift register unit, the gate of the transistor T2 receives the signal VDD, the transistor T2 is turned on, and the $N^{th}$ stage of shift register unit outputs the signal CLK. At this time, the $(N+1)^{th}$ stage of shift register unit receives the signal CLK outputted from the $N^{th}$ stage of shift register unit and also outputs the signal CLK, so that the transistor T3 is turned on, and the gate of the transistor T2 receives the signal VSS, and the transistor T2 is turned off. After that, the pull-down circuit 11 is configured to allow the $N^{th}$ stage of shift register unit to output a voltage stably.

A display device adopting such shift register units only scans in a specific direction, for example, scans a first gate line to an $N^{th}$ gate line in sequence. In some special cases, however, it needs to turn over the picture displayed on the display device by 180°, the display device adopting such shift register units can not realize such a function.

SUMMARY

In the embodiments of the present disclosure, there are provided a shift register unit, a gate driving apparatus and a display device for solving the problem that the conventional shift register unit can not realize a bi-directional scan function.

In view of the above, according to the embodiments of the present disclosure, there is provided a shift register unit comprising a driving module and an output module. The driving module is connected to the output module, and a connection point where the driving module is connected to the output module is a pull-up node.

The driving module is configured to control a signal at the pull-up node to be at a first level when a forward selection signal is at the first level and a forward scan signal is at the first level; is configured to control the signal at the pull-up node to be at the first level when the forward selection signal is changed from the first level to a second level and the forward scan signal is at the first level; is configured to control the signal at the pull-up node to be at the second level when the forward scan signal is at the first level and a reverse selection signal is at the first level; is configured to control the signal at the pull-up node to be at the first level when the reverse selection signal is at the first level and the reverse scan signal is at the first level; is configured to control the signal at the pull-up node to be at the first level when the reverse selection signal is changed from the first level to the second level and the reverse scan signal is at the first level; and is configured to control the signal at the pull-up node to be at the second level when the reverse scan signal is at the first level and the forward selection signal is at the first level.

The output module is configured to output a received clock signal from an output terminal of the shift register unit when the signal at the pull-up node is at the first level, and is configured to control the output terminal of the shift register unit to stop outputting the received clock signal when the signal at the pull-up node is at the second level.

The forward selection signal is a signal output from the output terminal of another shift register unit at a stage previous to that of the shift register unit, and the reverse selection signal is a signal output from the output terminal of another shift register unit at a stage subsequent to that of the shift register unit.

According to the embodiments of the present disclosure, there is further provided a gate driving apparatus comprising (N+2) stages of shift register units provided in the embodiments of the disclosure. An $n^{th}$ stage of shift register unit takes a mod(n/4)$^{th}$ clock signal as a received clock signal, n=0, 1, . . . , N, N+1, and N is a positive integer. Except for a zeroth stage of shift register unit and a $(N+1)^{th}$ stage of shift register unit, each stage of shift register unit receives a signal outputted from its previous stage of shift register unit as a forward selection signal, and receives a signal outputted from its subsequent stage of shift register unit as a reverse selection signal. The zeroth stage of shift register unit receives an initial trigger signal STV as a forward selection signal, and receives a signal outputted from a first stage of shift register unit as a reverse selection signal; the $(N+1)^{th}$ stage of shift register unit receives the initial trigger signal as a reverse selection signal, and receives a signal outputted from a $N^{th}$ stage of shift register unit as a forward selection signal.

According to the embodiments of the present disclosure, there is further provided a gate driving apparatus comprising (N+2) stages of shift register units provided in the embodiments of the present disclosure. A $n^{th}$ stage of shift register unit takes a mod(n/4)$^{th}$ clock signal as a received clock signal, n=0, 1, . . . , N, N+1, and N is a positive integer. Except for a zeroth stage of shift register unit, a first stage of shift register unit, a $N^{th}$ stage of shift register unit and a $(N+1)^{th}$ stage of shift register unit, each stage of shift register unit receives a signal outputted from its previous stage of shift register unit as a forward selection signal and a reverse feedback signal, and receives a signal outputted from its subsequent stage of shift register unit as a reverse selection signal and a forward feedback signal. The first stage of shift register unit receives an initial trigger signal as a forward selection signal, receives a signal outputted from the zeroth stage of shift register unit as a reverse feedback signal, and receives a signal outputted from a second stage of shift register unit as a reverse selection signal and a forward feedback signal. The $N^{th}$ stage of shift register unit receives the initial trigger signal as a reverse selection signal, receives a signal outputted from the $(N+1)^{th}$ stage of shift register unit as a forward feedback signal, and receives a signal outputted from a $(N-1)^{th}$ stage of shift register unit as a forward selection signal and a reverse feedback signal. The zeroth stage of shift register unit receives a signal outputted from the first stage of shift register unit as a reverse selection signal. The $(N+1)^{th}$ stage of shift register unit receives a signal outputted from the $N^{th}$ stage of shift register unit as a forward selection signal.

According to the embodiments of the present disclosure, there is further provided a display device comprising the gate driving apparatus provided in the embodiments of the present disclosure.

The embodiments of the present disclosure have the following beneficial effects:

In the shift register unit, the gate driving apparatus and the display device provided in the embodiments of the present disclosure, in a forward scan, that is, in a case in which the forward scan signal is at the first level and the reverse scan signal is at the second level, when the signal at the pull-up node is at the first level, that is, when the forward selection signal is at the first level or the forward selection signal is changed from the first level to the second level, the output module outputs the received clock signal from the output terminal of the $M^{th}$ stage of shift register unit comprising the output module, that is, the output module outputs the received clock signal to the gate line to which the shift register unit is connected, so as to select the gate line; and when the signal at the pull-up node is at the second level, that is, when the reverse selection signal is at the first level, the output terminal of the shift register unit does not output the received clock signal any more, that is, it does not output the received clock signal to the gate line to which the shift register unit is connected any more, so as not to select the gate line; the signal outputted from the output terminal of the $M^{th}$ stage of shift register unit functions as the forward selection signal received by the $(M+1)^{th}$ stage of shift register unit; the $(M+1)^{th}$ stage of shift register unit selects a gate line to which the $(M+1)^{th}$ stage of shift register unit is connected under the control of the received forward selection signal, and does not select the gate line to which the $(M+1)^{th}$ stage of shift register unit is connected under the control of the reverse selection signal any more, that is, under the control of the signal outputted from the output terminal of the $(M+2)^{th}$ stage of shift register unit, so as to perform a scan from a gate line to which the first stage of shift register unit is connected to a gate line to which the last stage of shift register unit is connected, that is, achieving a function of a forward scan.

On the other hand, in a reverse scan, that is, in a case in which the reverse scan signal is at the first level and the forward scan signal is at the second level, when the signal at the pull-up node is at the first level, that is, when the reverse selection signal is at the first level or the reverse selection signal is changed from the first level to the second level, the output module outputs the received clock signal from the output terminal of the $M^{th}$ stage of shift register unit comprising the output module, that is, the output module outputs the received clock signal to the gate line to which the shift register unit is connected, so as to select the gate line; and when the signal at the pull-up node is at the second level, that is, when the forward selection signal is at the first level, the output terminal of the shift register unit does not output the received clock signal any more, that is, it does not output the received clock signal to the gate line to which the shift register unit is connected any more, so as not to select the gate line; the signal outputted from the output terminal of the $M^{th}$ stage of shift register unit functions as the reverse selection signal received by the $(M-1)^{th}$ stage of shift register unit; the $(M-1)^{th}$ stage of shift register unit selects a gate line to which the $(M-1)^{th}$ stage of shift register unit is connected under the control of the received reverse selection signal, and does not select the gate line to which the $(M-1)^{th}$ stage of shift register unit is connected under the control of the forward selection signal any more, that is, under the control of the signal outputted from the output terminal of the $(M-2)^{th}$ stage of shift register unit, so as to perform a scan from a gate line to which the last stage of shift register unit is connected to a gate line to which the first stage of shift register unit is connected, that is, achieving a function of a reverse scan, and thus achieving a function of a bi-directional scan.

DETAILED DESCRIPTION

In the embodiments of the present disclosure, there are provided a shift register unit, a gate driving apparatus and a display device. With the shift register unit, the gate driving apparatus and the display device, a bi-directional scan function can be realized according to a forward scan signal, a forward selection signal, a reverse scan signal and a reverse selection signal received by a driving module in the shift register unit.

Hereinafter, detailed descriptions will be given to implementations of the shift register unit, the gate driving apparatus and the display device provided in the embodiments of the present disclosure with reference to the accompanying drawings.

Figure 1:
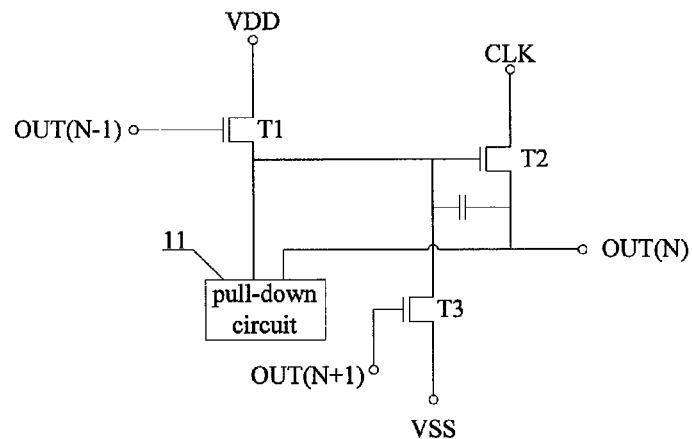
FIG. 1 is a schematic diagram showing a structure of a shift register unit in the prior art.
Figure 2:
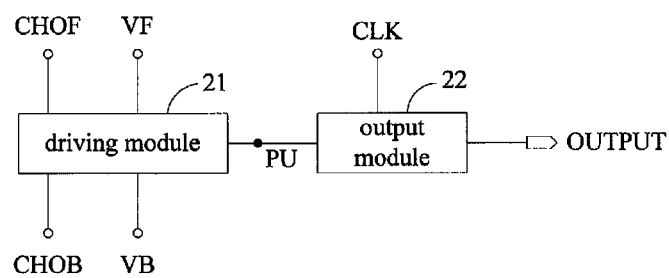
FIG. 2 is a first schematic diagram showing a structure of a shift register unit provided in the embodiments of the present disclosure.

As shown in FIG. 2, the shift register unit provided in the embodiments of the present disclosure comprises a driving module 21 and an output module 22, wherein the driving module 21 is connected to the output module 22, and a connection point where the driving module 21 is connected to the output module 22 is a pull-up node PU.

The driving module 21 is configured to control a signal at the pull-up node PU to be at a first level when a forward selection signal CHOF is at the first level and a forward scan signal VF is at the first level; is configured to control the signal at the pull-up node PU to be at the first level when the forward selection signal CHOF is changed from the first level to a second level and the forward scan signal VF is at the first level; is configured to control the signal at the pull-up node PU to be at a second level when a reverse selection signal CHOB is at the first level and the forward scan signal VF is at the first level; is configured to control the signal at the pull-up node PU to be at the first level when the reverse selection signal CHOB is at the first level and the reverse scan signal VB is at the first level; is configured to control the signal at the pull-up node to be at the first level when the reverse selection signal CHOB is changed from the first level to the second level and the reverse scan signal VB is at the first level; and is configured to control the signal at the pull-up node to be at the second level when the forward selection signal CHOF is at the first level and the reverse scan signal VB is at the first level.

The output module is configured to output a received clock signal CLK from an output terminal OUTPUT of the shift register unit when the signal at the pull-up node PU is at the first level, and is configured to control the output terminal OUTPUT of the shift register unit to stop outputting the received clock signal CLK when the signal at the pull-up node PU is at the second level.

Here, the forward selection signal CHOF is a signal output from an output terminal of another shift register unit at a stage previous to the shift register unit, and the reverse selection signal CHOB is a signal output from an output terminal of another shift register unit at a stage subsequent to the shift register unit. That is, assuming the shift register unit is a $K^{th}$ stage of shift register unit, the forward selection signal CHOF received by the $K^{th}$ stage of shift register unit is a signal output from an output terminal of the $(K-1)^{th}$ stage of shift register unit, and the reverse selection signal CHOB received by the $K^{th}$ stage of shift register unit is a signal output from an output terminal of the $(K+1)^{th}$ stage of shift register unit.

Figure 3:
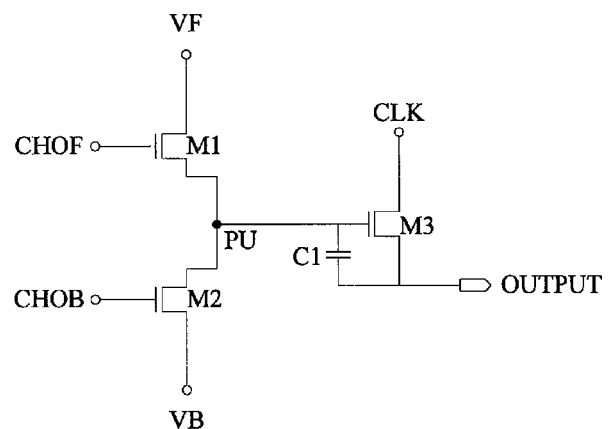
FIG. 3 is a second schematic diagram showing a structure of a shift register unit provided in the embodiments of the present disclosure.

Further, the driving module of the shift register unit provided in the embodiments of the present disclosure comprises a first transistor M1 and a second transistor T2, as shown in FIG. 3.

A first electrode of the first transistor M1 receives the forward scan signal VF, a gate of the first transistor M1 receives the forward selection signal CHOF, and a second electrode of the first transistor M1 is connected to the pull-up node PU. A first electrode of the second transistor M2 receives the reverse scan signal VB, a gate of the second transistor M2 receives the reverse selection signal CHOB, and a second electrode of the second transistor M2 is connected to the pull-up node PU.

The first transistor M1 is turned on when the forward selection signal CHOF is at the first level so that the pull-up node PU receives the forward scan signal VF; and the first transistor M1 is turned off when the forward selection signal CHOF is at the second level so that the pull-up node PU does not receive the forward scan signal VF any more.

The second transistor M2 is turned on when the reverse selection signal CHOB is at the first level so that the pull-up node PU receives the reverse scan signal VB; and the second transistor M2 is turned off when the reverse selection signal CHOB is at the second level so that the pull-up node PU does not receive the reverse scan signal VB any more.

Further, as shown in FIG. 3, the output module of the shift register unit provided in the embodiments of the present disclosure comprises a third transistor M3 and a first capacitor C1.

A first electrode of the third transistor M3 receives the clock signal CLK, a gate of the third transistor M3 is connected to the pull-up node PU, and a second electrode of the third transistor M3 is connected to the output terminal OUTPUT of the shift register unit; one terminal of the first capacitor C1 is connected to the pull-up node PU, and the other terminal of the first capacitor C1 is connected to the second electrode of the third transistor M3.

The third transistor M3 is configured to be turned on when the signal at the pull-up node PU is at the first level, so that the clock signal CLK received by the first electrode of the third transistor M3 is outputted from the output terminal OUTPUT of the shift register unit; and is configured to be turned off when the signal at the pull-up node PU is at the second level, so that the output terminal OUTPUT of the shift register unit does not output the received clock signal CLK any more.

In the forward scan, the forward scan signal VF is at the first level, the reverse scan signal VB is at the second level; when the forward selection signal CHOF is at the first level, the pull-up node PU receives the forward scan signal VF. At this time, the signal at the pull-up node PU is at the first level, and the signal at the pull-up node PU is stored in the first capacitor C1. When the forward selection signal CHOF is changed from the first level to the second level, the pull-up node PU does not receive the forward scan signal VF any more. However, due to the existence of the first capacitor C1, the signal at the pull-up node PU is maintained at the first level.

When the reverse selection signal CHOB is at the first level, the pull-up node PU receives the reverse scan signal VB. Since the reverse scan signal VB is at the second level at this time, the signal at the pull-up node PU is changed from the first level to the second level. When the reverse selection signal CHOB is changed to be at the second level, the pull-up node PU does not receive the reverse scan signal VB any more. However, due to the existence of the first capacitor C1, the signal at the pull-up node PU is maintained at the second level.

Figure 4:
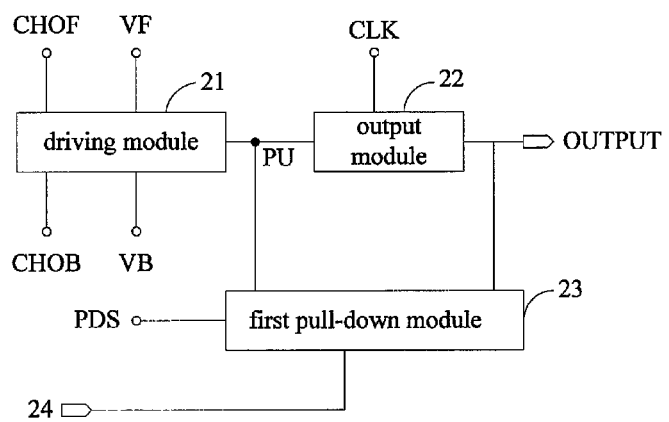
FIG. 4 is a third schematic diagram showing a structure of a shift register unit provided in the embodiments of the present disclosure.

Optionally, as shown in FIG. 4, the shift register unit provided in the embodiments of the present disclosure further comprises a first pull-down module 23. The first pull-down module 23 is connected to the pull-up node PU, the output terminal OUTPUT of the shift register unit, and a second level signal input terminal 24 respectively.

The first pull-down module 23 is configured to control both the pull-up node PU and the output terminal OUTPUT of the shift register unit to be connected to the second level signal input terminal 24 when a received pull-down signal PDS is at the first level and the signal at the pull-up node PU is at the second level; and is configured to control both the pull-up node PU and the output terminal OUTPUT of the shift register unit to be disconnected from the second level signal input terminal 24 when the signal at the pull-up node PU is at the first level.

Here, the pull-down signal PDS is the signal among the forward scan signal VF and the reverse scan signal VB which is at the first level; that is, the pull-down signal PDS in the forward scan is the forward scan signal VF, and the pull-down signal PDS in the reverse scan is the reverse scan signal VB; as an alternative, the pull-down signal PDS is the clock signal CLK.

The first pull-down module 23 controls the output terminal OUTPUT of the shift register unit to be connected to the second level signal input terminal 24 when the received pull-down signal PDS is at the first level and the signal at the pull-up node PU is at the second level. That is, when the output terminal OUTPUT of the shift register unit does not output the received clock signal CLK any more, the first pull-down module 23 controls the output terminal OUTPUT of the shift register unit to be connected to the second level signal input terminal 24, so that the output terminal of the shift register unit outputs a stable signal, that is, a signal at the second level, thus preventing a large noise from being generated at the output terminal OUTPUT of the shift register unit due to the influence of the clock signal during a period in which the gate line connected to the shift register unit is not selected.

Figure 5:
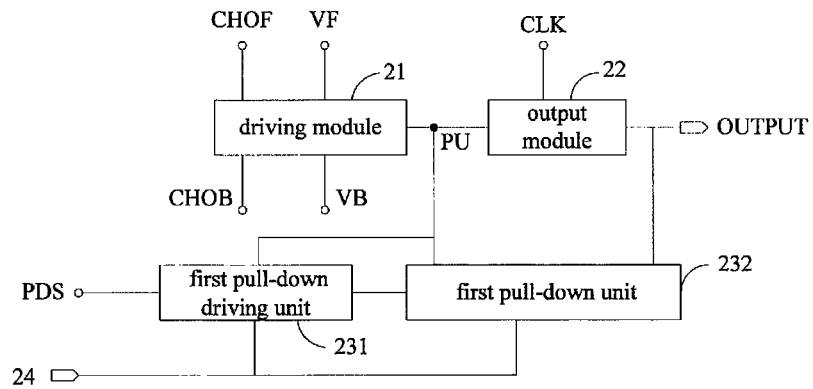
FIG. 5 is a fourth schematic diagram showing a structure of a shift register unit provided in the embodiments of the present disclosure.

Further, as shown in FIG. 5, the first pull-down module of the shift register unit provided in the embodiments of the present disclosure comprises a first pull-down driving unit 231 and a first pull-down unit 232. The first pull-down driving unit 231 is connected to the pull-up node PU, the second level signal input terminal 24 and the first pull-down unit 232, and the first pull-down unit 232 is connected to the pull-up node PU, the output terminal OUTPUT of the shift register unit and the second level signal input terminal 24.

The first pull-down driving unit is configured to output a signal at the first level to the first pull-down unit 232 when the received pull-down signal PDS is at the first level and the signal at the pull-up node PD is at the second level; and is configured to output a signal at the second level to the first pull-down unit 232 when the signal at the pull-up node PU at the first level.

The first pull-down unit 232 is configured to connect the pull-up node PU and the output terminal OUTPUT of the shift register unit to the second level signal input terminal 24 respectively when the signal at the first level outputted from the first pull-down driving unit 231 is received; and is configured to disconnect the pull-up node PU and the output terminal OUTPUT of the shift register unit from the second level signal input terminal 24 respectively when the signal at the second level outputted from the first pull-down driving unit 231 is received.

Figure 6:
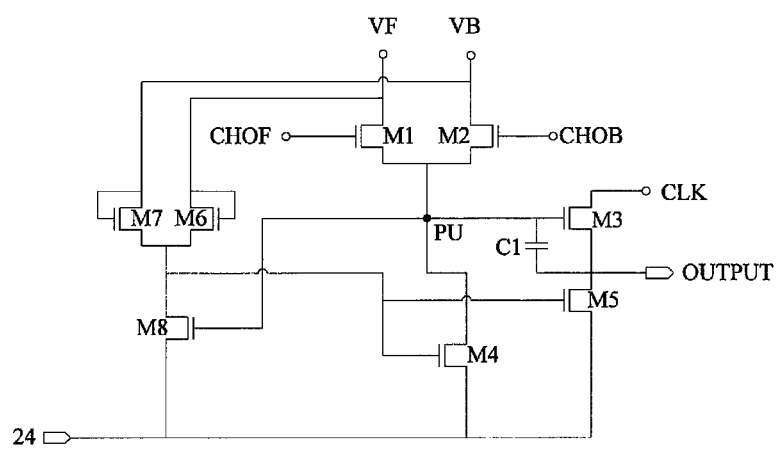
FIG. 6 is a fifth schematic diagram showing a structure of a shift register unit provided in the embodiments of the present disclosure.

Further, as shown in FIG. 6, the first pull-down unit of the shift register unit provided in the embodiments of the present disclosure comprises a fourth transistor M4 and a fifth transistor M5.

A first electrode of the fourth transistor M4 is connected to the pull-up node PU, a gate of the fourth transistor M4 receives the signal outputted from the first pull-down driving unit, and a second electrode of the fourth transistor M4 is connected to the second level signal input terminal 24. A first electrode of the fifth transistor M5 is connected to the output terminal OUTPUT of the shift register unit, a gate of the fifth transistor M5 receives the signal outputted from the first pull-down driving unit, and a second electrode of the fifth transistor M5 is connected to the second level signal input terminal 24.

The fourth transistor M4 is configured to be turned on when the signal at the first level outputted from the first pull-down driving unit is received, so that the pull-up node PU is connected to the second level signal input terminal 24; and is configured to be turned off when the signal at the second level outputted from the first pull-down driving unit is received, so that the pull-up node PU is disconnected from the second level signal input terminal 24. The fifth transistor M5 is configured to be turned on when the signal at the first level outputted from the first pull-down driving unit is received, so that the output terminal of the shift register unit is connected to the second level signal input terminal 24; and is configured to be turned off when the signal at the second level outputted from the first pull-down driving unit is received, so that the output terminal of the shift register unit is disconnected from the second level signal input terminal 24.

Further, as shown in FIG. 6, the first pull-down driving unit comprises a sixth transistor M6, a seventh transistor M7 and an eighth transistor M8. The pull-down signal PDS received by the first pull-down driving unit is the signal among the forward scan signal VF and the reverse scan signal VB which is at the first level.

A first electrode of the sixth transistor M6 receives the forward scan signal VF, a gate of the sixth transistor M6 receives the forward scan signal VF, and a second electrode of the sixth transistor M6 outputs a signal to the first pull-down unit; that is, the second electrode of the sixth transistor M6 outputs a signal to the gate of the fourth transistor M4 and the gate of the fifth transistor M5. A first electrode of the seventh transistor M7 receives the reverse scan signal VB, a gate of the seventh transistor M7 receives the reverse scan signal VB, and a second electrode of the seventh transistor M7 is connected to the second electrode of the sixth transistor M6. A first electrode of the eighth transistor M8 is connected to the second electrode of the sixth transistor M6, a gate of the eighth transistor M8 is connected to the pull-up node PU, and a second electrode of the eighth transistor M8 is connected to the second level signal input terminal 24.

The sixth transistor M6 is configured to be turned on when the forward scan signal VF is at the first level, and to be turned off when the forward scan signal VF is at the second level. The seventh transistor M7 is configured to be turned on when the reverse scan signal VB is at the first level, and to be turned off when the reverse scan signal VB is at the second level. The eighth transistor M8 is configured to be turned on when the signal at the pull-up node PU is at the first level, and to be turned off when the signal at the pull-up node PU is at the second level.

In a case in which the shift register unit adopts the structure shown in FIG. 3, during a period in which the gate line connected to the shift register unit is not selected, since both the forward selection signal CHOF and the reverse selection signal CHOB are at the second level, both the first transistor M1 and the second transistor M2 are turned off, the pull-up node PU is floated, and the signal at the second level stored in the first capacitor C1 can control the third transistor M3 to be turned off. However, during this period, the clock signal CLK at the first level will be coupled to the output terminal OUTPUT of the shift register unit, so that a noise is generated at the output terminal OUTPUT of the shift register unit.

In a case in which the shift register unit adopts the structure shown in FIG. 6, during the period in which the gate line connected to the shift register unit is not selected, although the first transistor M1 and the second transistor M2 are both turned off, the pull-up node PU can be connected to the second level signal input terminal 24 via the fourth transistor M4 since one of the forward scan signal VF and the reverse scan signal VB is at the first level, so that a stable voltage signal is maintained. Further, the output terminal OUTPUT of the shift register unit is connected to the second level signal input terminal 24 via the fifth transistor M5, so that the noise coupled by the clock signal CLK at the first level to the output terminal OUTPUT of the shift register unit is released to the second level signal input terminal 24, thus preventing the noise from being transmitted to the gate line to which the shift register unit.

Figure 7:
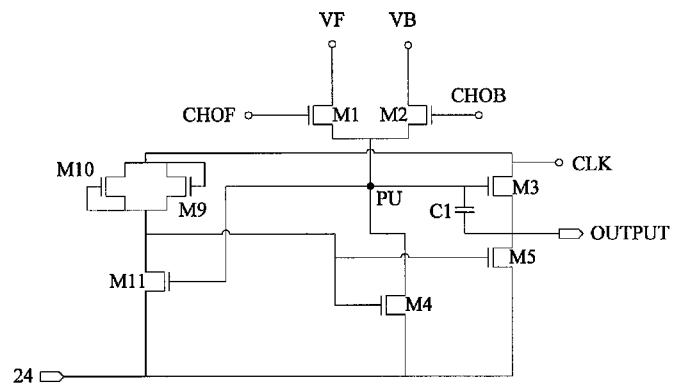
FIG. 7 is a sixth schematic diagram showing a structure of a shift register unit provided in the embodiments of the present disclosure.

Further, as shown in FIG. 7, when the pull-down signal PDS received by the first pull-down driving unit is the clock signal CLK, the pull-down driving unit comprises a ninth transistor M9, a tenth transistor M10 and an eleventh transistor M11.

A first electrode of the ninth transistor M9 receives the clock signal CLK, a gate of the ninth transistor M9 receives the clock signal CLK, and a second electrode of the ninth transistor M9 outputs a signal to the first pull-down unit, that is, the second electrode of the ninth transistor M9 outputs a signal to the gate of the fourth transistor M4 and the gate of the fifth transistor M5. A first electrode of the tenth transistor M10 receives the clock signal CLK, a gate of the tenth transistor M10 is connected to the second electrode of the ninth transistor M9, and a second electrode of the tenth transistor M10 is connected to the second electrode of the ninth transistor M9. A first electrode of the eleventh transistor M11 is connected to the second electrode of the ninth transistor M9, a gate of the eleventh transistor M11 is connected to the pull-up node PU, and a second electrode of the eleventh transistor M11 is connected to the second level signal input terminal 24.

The eleventh transistor M11 is configured to be turned on when the signal at the pull-up node PU is at the first level, so that the gate of the fourth transistor M4 and the gate of the fifth transistor M5 are both connected to the second level signal input terminal 24, that is, the fourth transistor M4 and the fifth transistor M5 are both turned off; and the eleventh transistor M11 is configured to be turned off when the signal at the pull-up node PU is at the second level, so that the gate of the fourth transistor M4 and the gate of the fifth transistor M5 are both disconnected from the second level signal input terminal 24, that is, the fourth transistor M4 and the fifth transistor M5 can be both turned on when the clock signal CLK is at the first level.

In a case in which the shift register unit adopts the structure shown in FIG. 6, during the period in which the gate line connected to the shift register unit is not selected, although the fourth transistor M4 and the fifth transistor M5 can be both turned on, so that the pull-up node PU maintains a stable voltage signal, and the noise coupled by the clock signal CLK to the output terminal OUTPUT of the shift register unit is released to the second level signal input terminal 24. However, during the period in which the gate line connected to the shift register unit is not selected, the gate of the fourth transistor M4 and the gate of the fifth transistor M5 receive the signal at the first level all the time, so that the fourth transistor M4 and the fifth transistor M5 are maintained to be turned on all the time, and thus the threshold voltages of the fourth transistor M4 and the fifth transistor M5 drift and the lifespan of the shift register unit is affected.

In a case in which the shift register unit adopts the structure shown in FIG. 7, during the period in which the gate line connected to the shift register unit is not selected, only when the clock signal CLK is at the first level, the gate of the fourth transistor M4 and the gate of the fifth transistor M5 can receive a signal at the first level and thus the fourth transistor M4 and the fifth transistor M5 can be turned on. At this time, the fourth transistor M4 can maintain the signal at the pull-up node at the second level, and the fifth transistor M5 can release the noise coupled by the clock signal CLK at the first level to the output terminal OUTPUT of the shift register unit to the second level signal input terminal.

When the clock signal CLK is at the second level, the gate of the fourth transistor M4 and the gate of the fifth transistor M5 receive a signal at the second level, and the fourth transistor M4 and the fifth transistor M5 are turned off. At this time, since the output terminal of the shift register unit outputs a signal at the second level, the clock signal at the second level will not affect the signal outputted from the output terminal of the shift register unit. Therefore, in the case in which the shift register unit adopts the structure shown in FIG. 7, the fourth transistor M4 and the fifth transistor M5 will not be maintained to be turned on for a long time, thus addressing the problem that the threshold voltages of the transistors drift due to a long term on-state, and prolonging the lifespan of the shift register unit.

Figure 8:
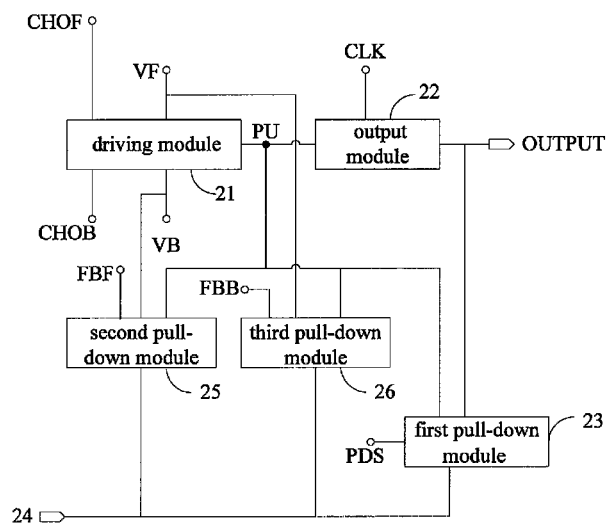
FIG. 8 is a seventh schematic diagram showing a structure of a shift register unit provided in the embodiments of the present disclosure.

Further, as shown in FIG. 8, the shift register unit provided in the embodiments of the present disclosure further comprises a second pull-down module 25 connected to the pull-up node PU and the second level signal input terminal 24.

The second pull-down module 25 is configured to control the pull-up node PU to be connected to the second level signal input terminal 24 when the reverse scan signal VB is at the second level and a forward feedback signal FBF is at the first level; is configured to control the pull-up node PU to be disconnected from the second level signal input terminal 24 when the reverse scan signal VB is at the first level; and is configured to control the pull-up node PU to be disconnected from the second level signal input terminal 24 when the reverse scan signal VB is at the second level and the forward feedback signal FBF is at the second level Here, the forward feedback signal FBF is a signal outputted from an output terminal of another shift register unit at a stage subsequent to the shift register unit. Assuming that the shift register unit is a $M^{th}$ stage of shift register unit, the forward feedback signal FBF received by the $M^{th}$ stage of shift register unit is the signal outputted from an output terminal of a $(M+1)^{th}$ stage of shift register unit.

Further, as shown in FIG. 8, the shift register unit provided in the embodiments of the present disclosure further comprises a third pull-down module 26 connected to the pull-up node PU and the second level signal input terminal 24.

The third pull-down module 26 is configured to control the pull-up node PU to be connected to the second level signal input terminal 24 when the forward scan signal VF is at the second level and a reverse feedback signal FBB is at the first level; is configured to control the pull-up node PU to be disconnected from the second level signal input terminal 24 when the forward scan signal VF is at the first level; and is configured to control the pull-up node PU to be disconnected from the second level signal input terminal 24 when the forward scan signal VF is at the second level and the reverse feedback signal FBB is at the second level.

Here, the reverse feedback signal FBB is a signal outputted from an output terminal of another shift register unit at a stage previous to the shift register unit. Assuming that the shift register unit is a $M^{th}$ stage of shift register unit, the reverse feedback signal FBB received by the $M^{th}$ stage of shift register unit is the signal outputted from an output terminal of a $(M-1)^{th}$ stage of shift register unit.

Here, the shift register unit provided in the embodiments of the present disclosure can only comprise the second pull-down module, and can only comprise the third pull-down module, and can comprise both the second pull-down module and the third pull-down module.

Figure 9:
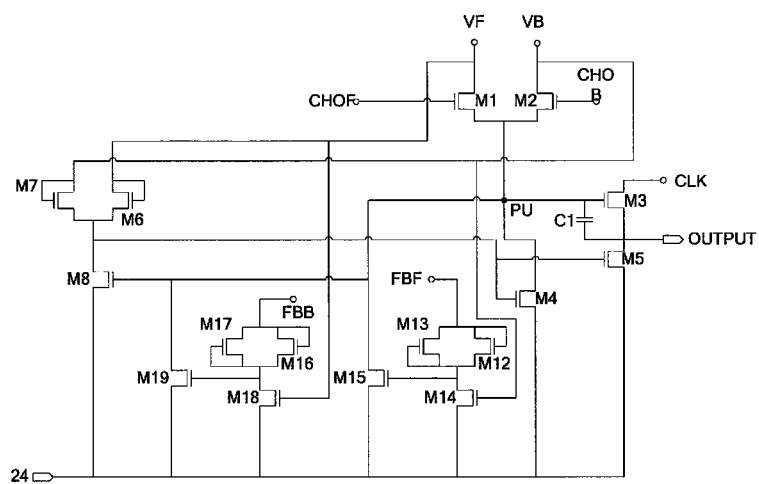
FIG. 9 is an eighth schematic diagram showing a structure of a shift register unit provided in the embodiments of the present disclosure.
Figure 10:
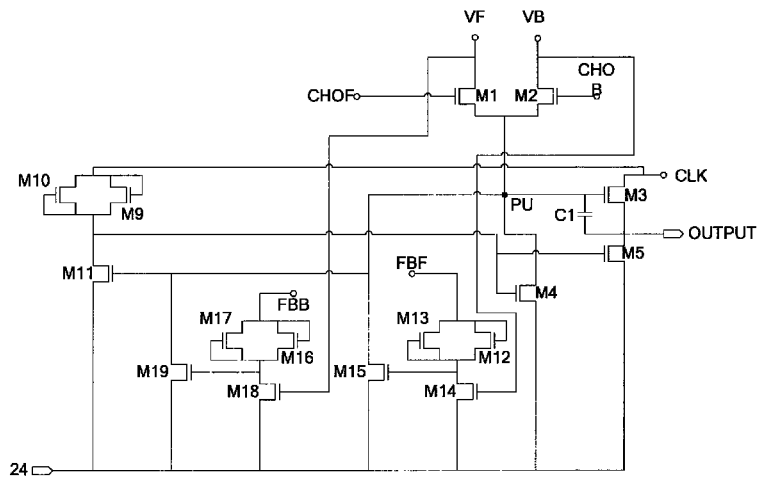
FIG. 10 is a ninth schematic diagram showing a structure of a shift register unit provided in the embodiments of the present disclosure.

In a case in which the shift register unit provided in the embodiments of the present disclosure comprises both the second pull-down module and the third pull-down module, the shift register unit provided in the embodiments of the present disclosure can employ a structure shown in FIG. 9 or that shown in FIG. 10.

In FIG. 9 or FIG. 10, the second pull-down module comprises a twelfth transistor M12, a thirteenth transistor M13, a fourteen transistor M14 and a fifteenth transistor M15. A first electrode of the twelfth transistor M12 receives the forward feedback signal FBF, a gate of the twelfth transistor M12 receives the forward feedback signal FBF, and a second electrode of the twelfth transistor M12 is connected to a first electrode of the fourteenth transistor M14. A first electrode of the thirteenth transistor M13 receives the forward feedback signal FBF, a gate of the thirteenth transistor M13 is connected to the first electrode of the fourteenth transistor M14, and a second electrode of the thirteenth transistor M13 is connected to the first electrode of the fourteenth transistor M14. A gate of the fourteenth transistor M14 receives the reverse scan signal VB, a second electrode of the fourteenth transistor M14 is connected to the second level signal input terminal 24. A first electrode of the fifteenth transistor M15 is connected to the pull-up node PU, a gate of the fifteenth transistor M15 is connected to the first electrode of the fourteenth transistor M14, and a second electrode of the fifteenth transistor M15 is connected to the second level signal input terminal 24.

The fourteenth transistor M14 is configured to be turned on when the received reverse scan signal VB is at the first level, so that the fifteenth transistor M15 is turned off and thus the pull-up node PU can not be connected to the second level signal input terminal 24 via the fifteenth transistor M15; and is configured to be turned off when the received reverse scan signal VB is at the second level, so that the fifteenth transistor M15 is turned on when the forward feedback signal FBF is at the first level, and thus the pull-up node PU is connected to the second level signal input terminal 24 via the fifteenth transistor M15. The fifteenth transistor M15 is configured to be turned off when the signal at the first electrode of the fourteenth transistor M14 is at the second level, and is configured to be turned on when the signal at the first electrode of the fourteenth transistor M14 is at the first level.

In the shift register unit shown in FIG. 9 or FIG. 10, the third pull-down module comprises a sixteenth transistor M16, a seventeenth transistor M17, an eighteenth transistor M18 and a nineteenth transistor M19. A first electrode of the sixteenth transistor M16 receives the reverse feedback signal FBB, a gate of the sixteenth transistor M16 receives the reverse feedback signal FBB, and a second electrode of the sixteenth transistor M16 is connected to a first electrode of the eighteenth transistor M18. A first electrode of the seventeenth transistor M17 receives the reverse feedback signal FBB, a gate of the seventeenth transistor M17 is connected to the first electrode of the eighteenth transistor M18, and a second electrode of the seventeenth transistor M17 is connected to the first electrode of the eighteenth transistor M18. A gate of the eighteenth transistor M18 receives the forward scan signal VF, and a second electrode of the eighteenth transistor M18 is connected to the second level signal input terminal 24. A first electrode of the nineteenth transistor M19 is connected to the pull-up node PU, a gate of the nineteenth transistor M19 is connected to the first electrode of the eighteenth transistor M18, and a second electrode of the nineteenth transistor M19 is connected to the second level signal input terminal 24.

The eighteenth transistor M18 is configured to be turned on when the received forward scan signal VF is at the first level, so that the nineteenth transistor M19 is turned off and thus the pull-up node PU can not be connected to the second level signal input terminal 24 via the nineteenth transistor M19; and is configured to be turned off when the received forward scan signal VF is at the second level, so that the nineteenth transistor M19 is turned on when the reverse feedback signal FBB is at the first level, and thus the pull-up node PU is connected to the second level signal input terminal 24 via the nineteenth transistor M19. The nineteenth transistor M19 is configured to be turned off when the signal at the first electrode of the eighteenth transistor M18 is at the second level, and is configured to be turned on when the signal at the first electrode of the eighteenth transistor M18 is at the first level.

Figure 11:
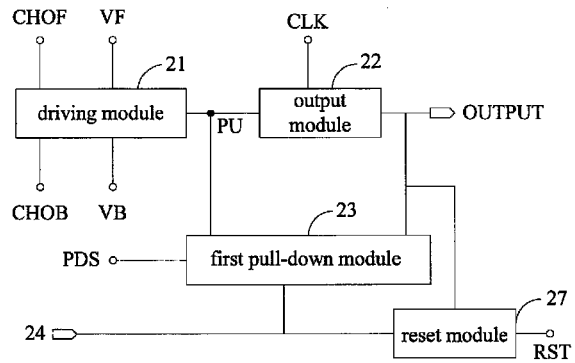
FIG. 11 is a tenth schematic diagram showing a structure of a shift register unit provided in the embodiments of the present disclosure.
Figure 12:
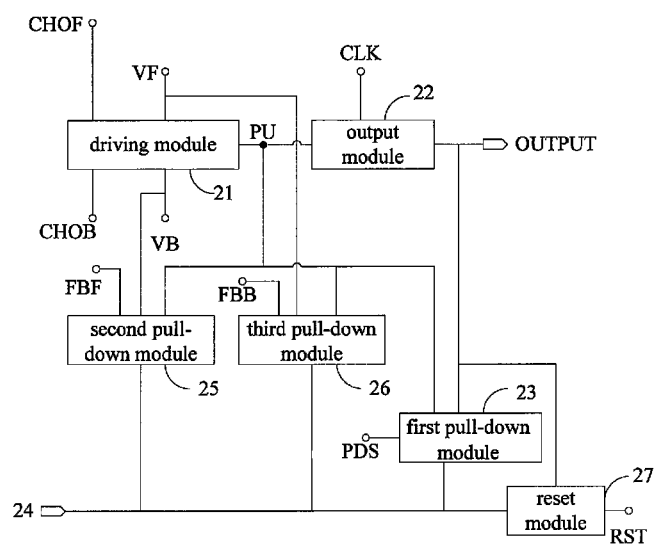
FIG. 12 is an eleventh schematic diagram showing a structure of a shift register unit provided in the embodiments of the present disclosure.

Additionally, the shift register unit provided in the embodiments of the present disclosure further comprises a reset module. The shift register unit provided in the embodiments of the present disclosure can comprise at least one of the following three modules: the second pull-down module, the third pull-down module and the reset module. The shift register unit shown in FIG. 11 only comprises the reset module. The shift register unit shown in FIG. 12 comprises the second pull-down module, the third pull-down module and the reset module. The reset module 27 shown in FIG. 11 or FIG. 12 is connected to the output terminal OUTPUT of the shift register unit and the second level signal input terminal 24. The reset module 27 is configured to connect the output terminal OUTPUT of the shift register unit to the second level signal input terminal 24 when a received reset signal RST is at the first level, and is configured to disconnect the output terminal OUTPUT of the shift register unit from the second level signal input terminal 24 when the received reset signal RST is at the second level.

Figure 13:
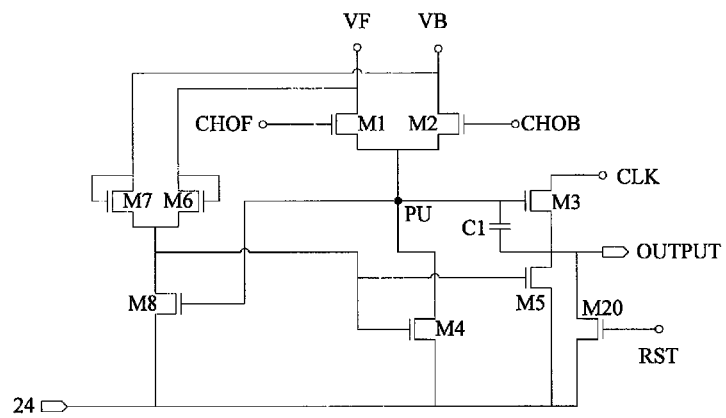
FIG. 13 is a twelfth schematic diagram showing a structure of a shift register unit provided in the embodiments of the present disclosure.
Figure 14:
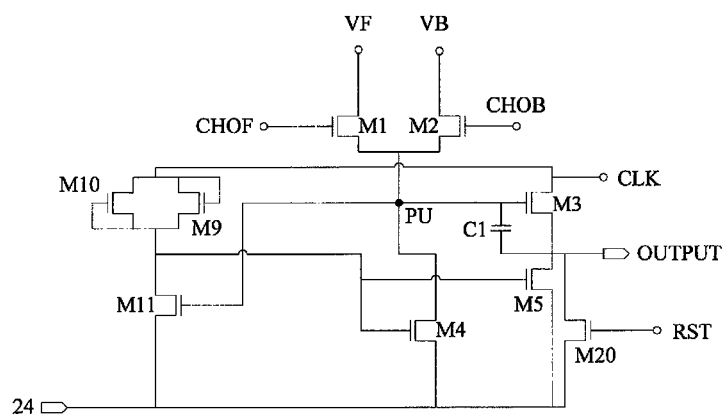
FIG. 14 is a thirteenth schematic diagram showing a structure of a shift register unit provided in the embodiments of the present disclosure.

In a case in which the shift register unit provided in the embodiments of the present disclosure only comprises the reset module, the shift register unit provided in the embodiments of the present disclosure can employ a structure shown in FIG. 13 or FIG. 14. In a case in which the shift register unit provided in the embodiments of the present disclosure comprises the second pull-down module, the third pull-down module and the reset module, the shift register unit provided in the embodiments of the present disclosure can employ a structure shown in FIG. 15 or FIG. 16.

In the shift register unit shown in any of FIG. 13, FIG. 14, FIG. 15 and FIG. 16, the reset module comprises a twentieth transistor M20. A first electrode of the twentieth transistor M20 is connected to the output terminal OUTPUT of the shift register unit, a gate of twentieth transistor M20 receives the reset signal RST, and a second electrode of twentieth transistor M20 is connected to the second level signal input terminal 24. The twentieth transistor M20 is configured to be turned on when the received reset signal RST is at the first level, so that the output terminal OUTPUT of the shift register unit is connected to the second level signal input terminal 24; and is configured to be turned off when the received reset signal RST is at the second level, so that the output terminal OUTPUT of the shift register unit is not connected to the second level signal input terminal 24 via the twentieth transistor M20 any more.

For a transistor in the field of a liquid crystal display or in the field of an OLED display, there is no explicit distinction between a drain and a source of the transistor. Therefore, the first electrode of the transistor mentioned in the embodiments of the present disclosure can be the source (or drain) of the transistor, and the second electrode of the transistor can be the drain (or source) of the transistor. If the source of the transistor is the first electrode, the drain of the transistor is the second electrode; and if the drain of the transistor is the first electrode, the source of the transistor is the second electrode.

In a case in which the transistors mentioned in the embodiments of the present disclosure are N-type transistors, the first level is a high level, the second level is a low level, and the second level signal input terminal is a low level signal input terminal. In a case in which the transistors mentioned in the embodiments of the present disclosure are P-type transistors, the first level is a low level, the second level is a high level, and the second level signal input terminal is a high level signal input terminal.

In order to illustrate the shift register unit provided in the embodiments of the present disclosure, detailed descriptions will be given to the operational principle of the shift register unit provided in the embodiments of the present disclosure in connection with the timing diagrams shown in FIG. 17 and FIG. 18, by taking a case in which the transistors mentioned in the embodiments of the present disclosure are N-type transistors as an example. Here, FIG. 17 is a timing diagram of the shift register unit in operation when a forward scan is performed, and FIG. 18 is a timing diagram of the shift register unit in operation when a reverse scan is performed.

Figure 16:
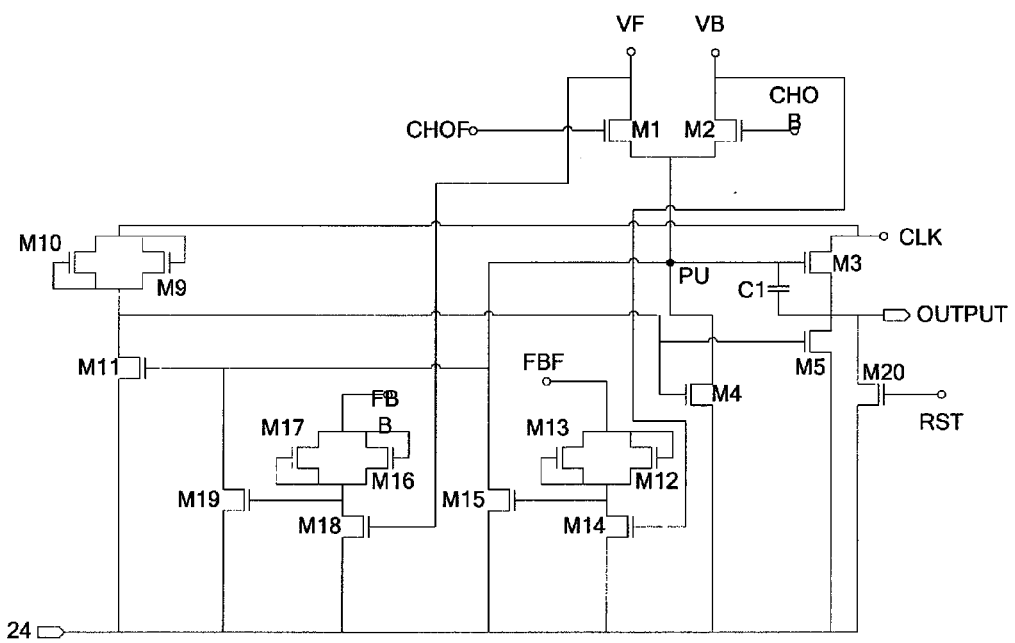
FIG. 16 is a fifteenth, schematic diagram showing a structure of a shift register unit provided in the embodiments of the present disclosure.
Figure 17:
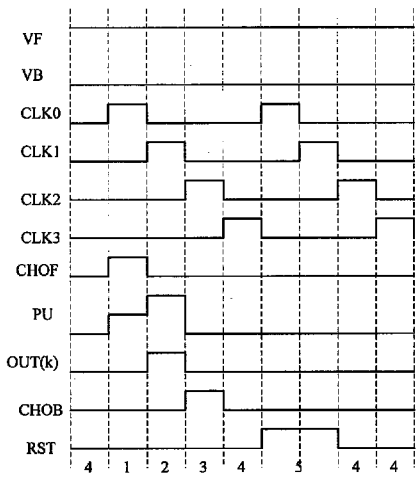
FIG. 17 is a timing diagram of the shift register unit provided in the embodiments of the present disclosure in a forward scan.
Figure 18:
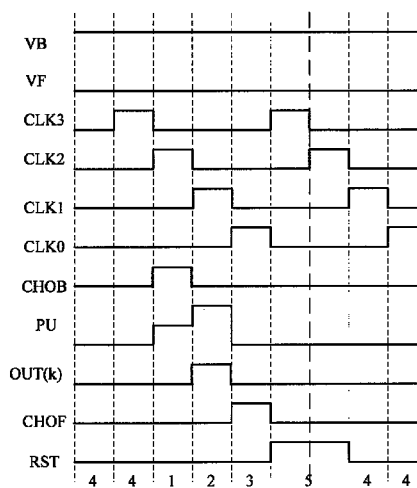
FIG. 18 is a timing diagram of the shift register unit provided in the embodiments of the present disclosure in a reverse scan.

As shown in FIG. 17, in the forward scan, the forward scan signal VF is at a high level, and the reverse scan signal VB is at a low level. Taking a $k^{th}$ stage of shift register unit as an example and assuming that the $k^{th}$ stage of shift register unit takes the first clock signal CLK1 as the received clock signal CLK, and the operational timing sequence of the shift register unit provided in the embodiments of the present disclosure (FIG. 13, FIG. 14, FIG. 15 and FIG. 16) comprises five periods.

During a first period, a $(k-1)^{th}$ stage of shift register unit outputs a signal at a high level, that is, the forward selection signal CHOF is at a high level, the first transistor M1 is turned on, and the pull-up node PU receives the forward scan signal VF. Therefore, the signal at the pull-up node PU is at a high level, the third transistor M3 is turned on, and the first clock signal CLK1 is outputted from the output terminal OUTPUT of the shift register unit. At this time, since the first clock signal CLK1 is at a low level, the signal OUT(k) outputted from the $k^{th}$ stage of shift register unit is at a low level.

During a second period, the $(k-1)^{th}$ stage of shift register outputs a signal at a low level, that is, the forward selection signal CHOF is at a low level, the first transistor M1 is turned off, and the pull-up node PU is floated. Due to the storage effect of the first capacitor C1, the signal at the pull-up node PU is maintained at a high level, and the third transistor M3 is maintained to be turned on. At this time, since the first clock signal CLK1 is at a high level, the signal OUT(k) outputted from the $k^{th}$ stage of shift register unit is at a high level, and the level of the signal at the pull-up node PU rises again. The signal OUT(k) outputted from the $k^{th}$ stage of shift register unit serves as a forward selection signal CHOF of a $(k+1)^{th}$ stage of shift register unit, therefore, the $(k+1)^{th}$ stage of shift register unit can also output a received second clock signal CLK2 from the output terminal of the $(k+1)^{th}$ stage of shift register unit.

During a third period, the $(k-1)^{th}$ stage of shift register outputs a signal at a low level, that is, the forward selection signal CHOF is at a low level, the first transistor M1 is turned off. However, at this time, the second clock signal CLK2 is at a high level, and the $(k+1)^{th}$ stage of shift register unit can output the received second clock signal CLK2 from the output terminal of the $(k+1)^{th}$ stage of shift register unit. Therefore, the reverse selection signal CHOB is at a high level, the second transistor M2 is turned on, the pull-up node PU receives the reverse scan signal VB, and the signal at the pull-up node PU is at a low level since the reverse scan signal VB is at a low level. In the shift register unit shown in FIG. 15 and FIG. 16, since the reverse scan signal VB is at a low level, the fourteenth transistor M14 is turned off; and since the forward feedback signal FBF (not shown in FIG. 17) is at a high level, the signal at the first electrode of the fourteenth transistor M14 is at a high level, and thus the fifteenth transistor M15 is turned on, the pull-up node PU is connected to the second level signal input terminal 24, (that is, the low level signal input terminal), therefore, the signal at the pull-up node PU is at a low level.

During a fourth period, since the pull-up node PU is at a low level, in the shift register unit shown in FIG. 13 and FIG.

15, the eighth transistor M8 is turned off; since the forward scan signal VF is at a high level, the sixth transistor M6 is turned on, the first electrode of the eighth transistor M8 receives the forward scan signal VF, and thus the signal at the first electrode of the eighth transistor M8 is at a high level. Therefore, the fourth transistor M4 and the fifth transistor M5 are both turned on, such that the pull-up node PU and the output terminal OUTPUT of the $k^{th}$ stage of shift register unit are connected to the second level signal input terminal 24 (that is, the low level signal input terminal), respectively. In the shift register unit shown in FIG. 14 and FIG. 16, the eleventh transistor M11 is turned off, and the first electrode of the eleventh transistor M11 receives the first clock signal CLK1; when the first clock signal CLK1 is at a high level, the signal at the first electrode of the eleventh transistor M11 is at a high level. Therefore, the fourth transistor M4 and the fifth transistor M5 are both turned on, such that the pull-up node PU and the output terminal OUTPUT of the $k^{th}$ stage of shift register unit are connected to the second level signal input terminal 24 (that is, the low level signal input terminal), respectively. Thus, during the fourth period, the output terminal OUTPUT of the $k^{th}$ stage of shift register unit outputs a signal at a low level.

During a fifth period, the reset signal RST is at a high level, the twentieth transistor M20 is turned on, such that the output terminal OUTPUT of the $k^{th}$ stage of shift register unit is connected to the second level signal input terminal 24 (that is, the low level signal input terminal), and thus the output terminal OUTPUT of the $k^{th}$ stage of shift register unit outputs a signal at a low level.

After that, the shift register unit is maintained in the fifth period when the reset signal RST is at a high level, and the shift register unit is maintained in the fourth period when the reset signal RST is at a low level; until the forward selection signal CHOF received by the shift register unit provided in the embodiments of the present disclosure is at a high level, the first period is repeated again.

As shown in FIG. 18, in the reverse scan, the reverse scan signal VB is at a high level, and the forward scan signal VF is at a low level. Taking a $k^{th}$ stage of shift register unit as an example and assuming that the $k^{th}$ stage of shift register unit takes the first clock signal CLK1 as a received clock signal CLK, and the operational timing sequence of the shift register unit provided in the embodiments of the present disclosure (FIG. 13, FIG. 14, FIG. 15 and FIG. 16) comprises five periods.

During a first period, a $(k+1)^{th}$ stage of shift register unit outputs a signal at a high level, that is, the reverse selection signal CHOB is at a high level, the second transistor M2 is turned on, and the pull-up node PU receives the reverse scan signal VB. Therefore, the signal at the pull-up node PU is at a high level, the third transistor M3 is turned on, and the first clock signal CLK1 is outputted from the output terminal OUTPUT of the shift register unit. At this time, since the first clock signal CLK1 is at a low level, the signal OUT(k) outputted from the $k^{th}$ stage of shift register unit is at a low level.

During a second period, the $(k+1)^{th}$ stage of shift register outputs a signal at a low level, that is, the reverse selection signal CHOB is at a low level, the second transistor M2 is turned off, and the pull-up node PU is floated. Due to the storage effect of the first capacitor C1, the signal at the pull-up node PU is maintained at a high level, and the third transistor M3 is maintained to be turned on. At this time, since the first clock signal CLK1 is at a high level, the signal OUT(k) outputted from the $k^{th}$ stage of shift register unit is at a high level, and the level of the signal at the pull-up node PU rises again. The signal OUT(k) outputted from the $k^{th}$ stage of shift register unit serves as a reverse selection signal CHOB of a $(k-1)^{th}$ stage of shift register unit, therefore, the $(k-1)^{th}$ stage of shift register unit can also output a received zeroth clock signal CLK0 from the output terminal of the $(k-1)^{th}$ stage of shift register unit.

During a third period, the $(k+1)^{th}$ stage of shift register outputs a signal at a low level, that is, the reverse selection signal CHOB is at a low level, the second transistor M2 is turned off. However, at this time, the zeroth clock signal CLK0 is at a high level, and the $(k-1)^{th}$ stage of shift register unit can output the received zeroth clock signal CLK0 from the output terminal of the $(k-1)^{th}$ stage of shift register unit. Therefore, the forward selection signal CHOF is at a high level, the first transistor M1 is turned on, and the pull-up node PU receives the forward scan signal VF, and the signal at the pull-up node PU is at a low level since the forward scan signal VF is at a low level. In the shift register unit shown in FIG. 15 and FIG. 16, since the forward scan signal VF is at a low level, the eighth transistor M18 is turned off; and since the reverse feedback signal FBB (not shown in FIG. 18) is at a high level, the signal at the first electrode of the eighth transistor M18 is at a high level, and thus the nineteenth transistor M19 is turned on, the pull-up node PU is connected to the second level signal input terminal 24, (that is, the low level signal input terminal), therefore, the signal at the pull-up node PU is at a low level.

Figure 15:
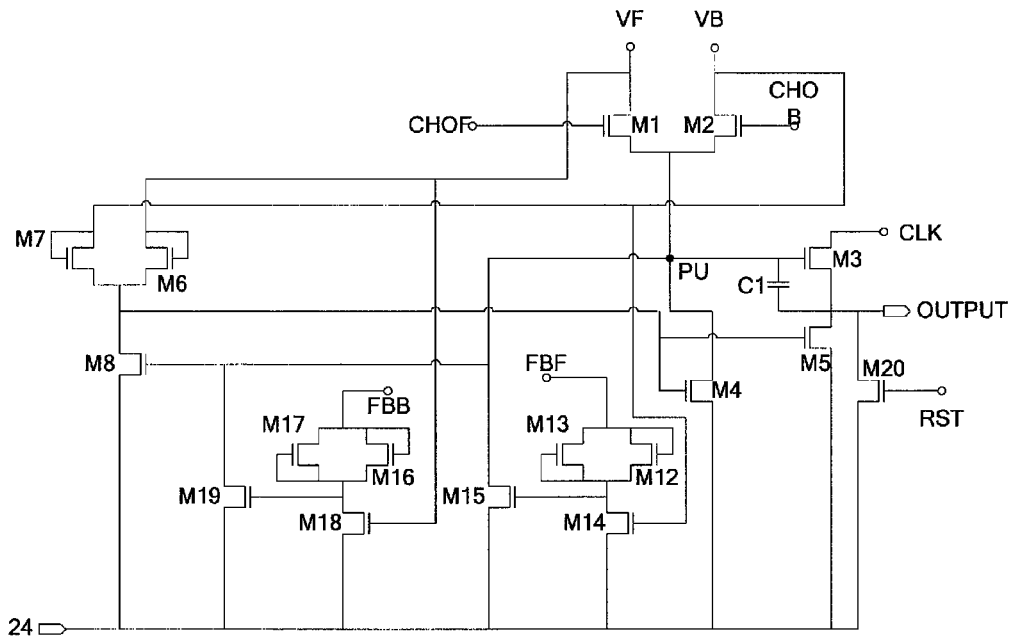
FIG. 15 is a fourteenth schematic diagram showing a structure of a shift register unit provided in the embodiments of the present disclosure.

During a fourth period, since the pull-up node PU is at a low level, in the shift register unit shown in FIG. 13 and FIG. 15, the eighth transistor M8 is turned off; since the reverse scan signal VB is at a high level, the seventh transistor M7 is turned on, the first electrode of the eighth transistor M8 receives the reverse scan signal VB, and thus the signal at the first electrode of the eighth transistor M8 is at a high level. Therefore, the fourth transistor M4 and the fifth transistor M5 are both turned on, such that the pull-up node PU and the output terminal OUTPUT of the $k^{th}$ stage of shift register unit are connected to the second level signal input terminal 24 (that is, the low level signal input terminal), respectively. In the shift register unit shown in FIG. 14 and FIG. 16, the eleventh transistor M11 is turned off, and the first electrode of the eleventh transistor M11 receives the first clock signal CLK1; when the first clock signal CLK1 is at a high level, the signal at the first electrode of the eleventh transistor M11 is at a high level. Therefore, the fourth transistor M4 and the fifth transistor M5 are both turned on, such that the pull-up node PU and the output terminal OUTPUT of the $k^{th}$ stage of shift register unit are connected to the second level signal input terminal 24 (that is, the low level signal input terminal), respectively. Thus, during the fourth period, the output terminal OUTPUT of the $k^{th}$ stage of shift register unit outputs a signal at a low level.

During a fifth period, the reset signal RST is at a high level, the twentieth transistor M20 is turned on, such that the output terminal OUTPUT of the $k^{th}$ stage of shift register unit is connected to the second level signal input terminal 24 (that is, the low level signal input terminal), and thus the output terminal OUTPUT of the $k^{th}$ stage of shift register unit outputs a signal at a low level.

After that, the shift register unit is maintained in the fifth period when the reset signal RST is at a high level, and the shift register unit is maintained in the fourth period when the reset signal RST is at a low level; until the reverse selection signal CHOB received by the shift register unit provided in the embodiments of the present disclosure is at a high level, the first period is repeated again.

The P-type transistor differs from the N-type transistor only in that: the P-type transistor is turned on when a signal received at the gate of the P-type transistor is at a low level, and is turned off when the signal received at the gate of the P-type transistor is at a high level; the N-type transistor is turned on when a signal received at the gate of the N-type transistor is at a high level, and is turned off when the signal received at the gate of the N-type transistor is at a low level. Therefore, the operational principle of a shift register unit only comprising the P-type transistors is similar to that of the shift register unit only comprising the N-type transistors, and the details thereof are omitted.

Figure 19:
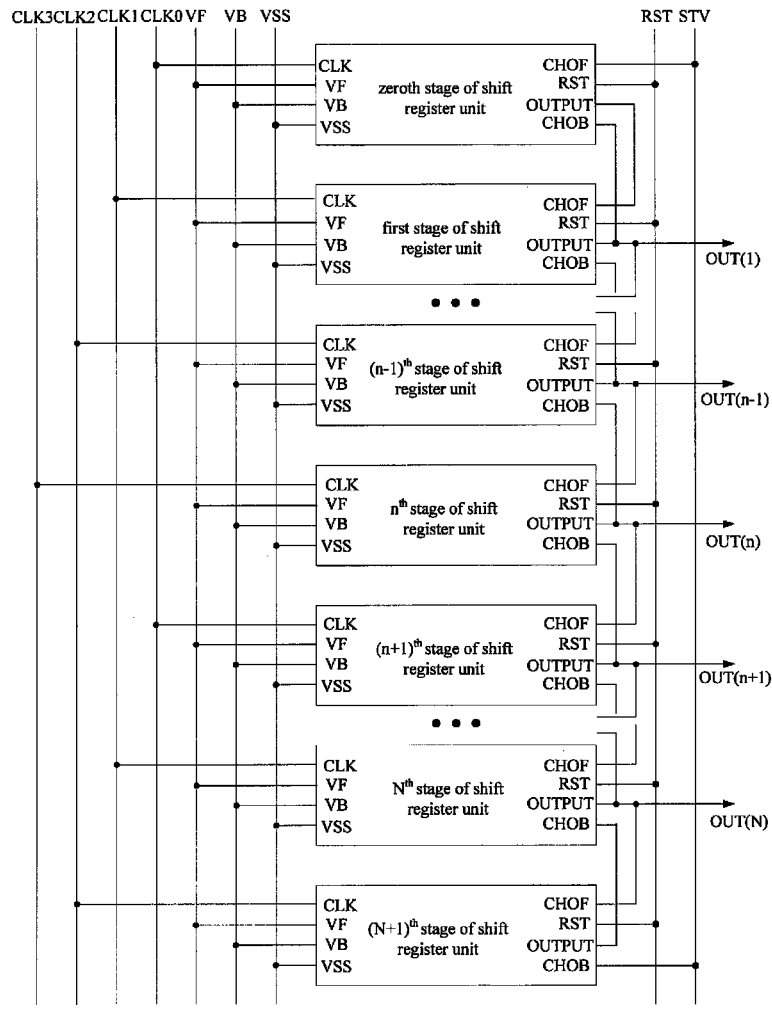
FIG. 19 is a first schematic diagram showing a structure of a gate driving apparatus provided in the embodiments of the present disclosure.

The gate driving apparatus provided in the embodiments of the present disclosure is as shown in FIG. 19. The gate driving apparatus comprises (N+2) stages of shift register units provided in the embodiments of the present disclosure, wherein a $n^{th}$ stage of shift register unit takes a $mod(n/4)^{th}$ clock signal as a received clock signal CLK, n=0, 1, ..., N, N+1, and N is a positive integer. The value of mod(n/4) is one of 0, 1, 2 and 3, when n=1, a first stage of shift register unit takes a first clock signal CLK1 as the received clock signal CLK; when n=2, a second stage of shift register unit takes a second clock signal CLK2 as the received clock signal CLK; when n=3, a third stage of shift register unit takes a third clock signal CLK3 as the received clock signal CLK; when n=4, a fourth stage of shift register unit takes a zeroth clock signal CLK0 as the received clock signal CLK; and by analogy, the $n^{th}$ stage of shift register unit takes the $mod(n/4)^{th}$ clock signal as the received clock signal CLK.

Except for the zeroth stage of shift register unit and a $(N+1)^{th}$ stage of shift register unit, each stage of shift register unit receives a signal outputted from its previous stage of shift register unit as a forward selection signal, and receives a signal outputted from its subsequent stage of shift register unit as a reverse selection signal. That is, the $n^{th}$ stage of shift register unit receives a signal OUT(n−1) outputted from a $(n−1)^{th}$ stage of shift register unit as a forward selection signal CHOF, and the $n^{th}$ stage of shift register unit receives a signal OUT(n+1) outputted from a $(n+1)^{th}$ stage of shift register unit as a reverse selection signal CHOB. The zeroth stage of shift register unit receives an initial trigger signal STV as a forward selection signal CHOF, and receives a signal OUT(1) outputted from a first stage of shift register unit as a reverse selection signal CHOB; the $(N+1)^{th}$ stage of shift register unit receives the initial trigger signal STV as a reverse selection signal CHOB, and the $(N+1)^{th}$ stage of shift register unit receives a signal OUT(N) outputted from a $N^{th}$ stage of shift register unit as a forward selection signal CHOF.

Figure 20:
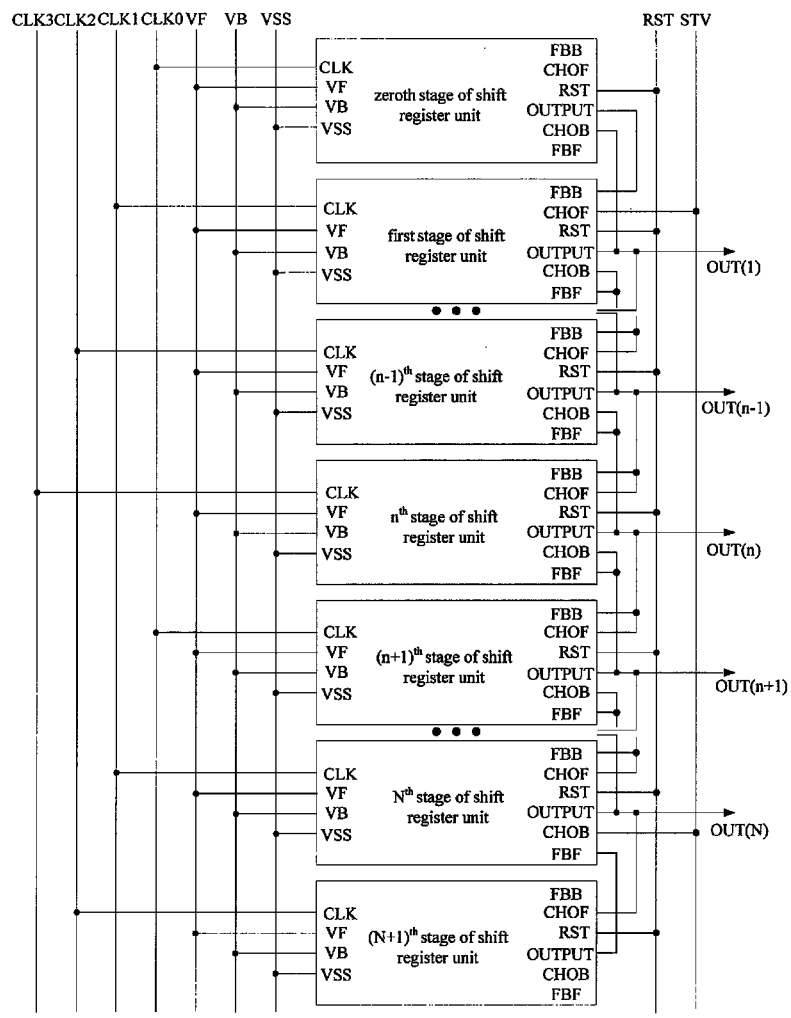
FIG. 20 is a second schematic diagram showing a structure of a gate driving apparatus provided in the embodiments of the present disclosure.

In the embodiments of the present disclosure, there is further provided a gate driving apparatus as shown in FIG. 20. The gate driving apparatus comprises (N+2) stages of shift register units provided in the embodiments of the present disclosure, wherein a $n^{th}$ stage of shift register unit takes a $mod(n/4)^{th}$ clock signal as a received clock signal CLK, n=0, 1, ..., N, N+1, and N is a positive integer. The value of mod(n/4) is one of 0, 1, 2 and 3, when n=0, a zeroth stage of shift register unit takes a zeroth clock signal CLK0 as the received clock signal CLK; when n=1, a first stage of shift register unit takes a first clock signal CLK1 as the received clock signal CLK; when n=2, a second stage of shift register unit takes a second clock signal CLK2 as the received clock signal CLK; when n=3, a third stage of shift register unit takes a third clock signal CLK3 as the received clock signal CLK; when n=4, a fourth stage of shift register unit takes a zeroth clock signal CLK0 as the received clock signal CLK; and by analogy, the $n^{th}$ stage of shift register unit takes the $mod(n/4)^{th}$ clock signal as the received clock signal CLK.

Except for the zeroth stage of shift register unit, the first stage of shift register unit, the $N^{th}$ stage of shift register unit and the $(N+1)^{th}$ stage of shift register unit, each stage of shift register unit receives a signal outputted from its previous stage of shift register unit as a forward selection signal and a reverse feedback signal, and receives a signal outputted from its subsequent stage of shift register unit as a reverse selection signal and a forward feedback signal. That is, the $n^{th}$ stage of shift register unit receives a signal OUT(n−1) outputted from a $(n−1)^{th}$ stage of shift register unit as a forward selection signal CHOF and a reverse feedback signal FBB, and the $n^{th}$ stage of shift register unit receives a signal OUT(n+1) outputted from a $(n+1)^{th}$ stage of shift register unit as a reverse selection signal CHOB and a forward feedback signal FBF. The first stage of shift register unit receives an initial trigger signal STV as a forward selection signal CHOF, receives a signal OUT(0) outputted from the zeroth stage of shift register unit as a reverse feedback signal FBB, and receives a signal OUT(2) outputted from a second stage of shift register unit as a reverse selection signal CHOB and a forward feedback signal FBF. The $N^{th}$ stage of shift register unit receives the initial trigger signal STV as a reverse selection signal CHOB, receives a signal OUT(N+1) outputted from the $(N+1)^{th}$ stage of shift register unit as a forward feedback signal FBF, and receives a signal OUT(N−1) outputted from a $(N−1)^{th}$ stage of shift register unit as a forward selection signal CHOF and a reverse feedback signal FBB. The zeroth stage of shift register unit receives a signal OUT(1) outputted from the first stage of shift register unit as a reverse selection signal CHOB. The $(N+1)^{th}$ stage of shift register unit receives a signal OUT(N) outputted from the $N^{th}$ stage of shift register unit as a forward selection signal CHOF.

Figure 21:
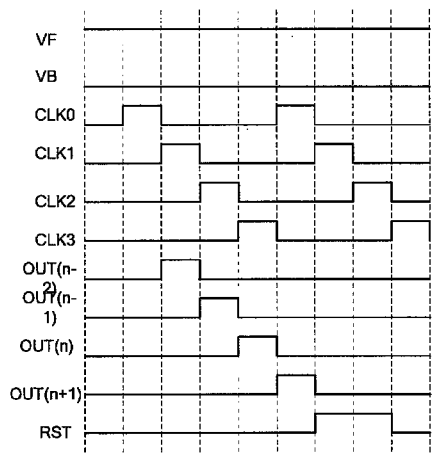
FIG. 21 is a timing diagram of the gate driving apparatus provided in the embodiments of the present disclosure in a forward scan.

FIG. 21 is a timing diagram of the gate driving apparatus provided in the embodiments of the present disclosure in a forward scan.

When the gate driving apparatus shown in FIG. 19 is adopted, it is presumed that the $n^{th}$ stage of shift register unit takes the third clock signal CLK3 as the received clock signal. When the gate driving apparatus performs a forward scan, the forward scan signal VF is at a high level, the reverse scan signal VB is at a low level, and the initial trigger signal STV supplies the forward selection signal CHOF to the first stage of shift register unit at the beginning of each frame. When the first clock signal CLK1 is at a high level, the first stage of shift register unit outputs a signal at a high level, that is, the signal OUT(1) is at the high level, and the signal OUT(1) serves as the forward selection signal CHOF for the second stage of shift register unit simultaneously. The signal OUT(n−2) outputted from the $(n−2)^{th}$ stage of shift register unit serves as the forward selection signal CHOF for the $(n−1)^{th}$ stage of shift register unit, and when the signal OUT(n−2) is at a high level, the $(n−1)^{th}$ stage of shift register unit outputs the second clock signal CLK2; the signal OUT(n−1) outputted from the $(n−1)^{th}$ stage of shift register unit is the second clock signal CLK2 at this time. Since the signal OUT(n−1) outputted from the $(n−1)^{th}$ stage of shift register unit functions as the forward selection signal CHOF for the $n^{th}$ stage of shift register unit; that is, the forward selection signal CHOF for the $n^{th}$ stage of shift register unit is the second clock signal CLK2 at this time. When the second clock signal CLK2 is at a high level, the $(n−2)^{th}$ stage of shift register unit does not output the received first clock signal CLK1 any more, and the $n^{th}$ stage of shift register unit outputs the received third clock signal CLK3, that is, the signal OUT(n) is the third clock signal CLK3 at this time. Since the signal OUT(n) outputted from the $n^{th}$ stage of shift register unit functions as the forward selection signal CHOF for the $(n+1)^{th}$ stage of shift) register unit; that is, the forward selection signal CHOF for the $(n+1)^{th}$ stage of shift register unit is the third clock signal CLK3 at this time. When the third clock signal CLK3 is at a high level, the $(n-1)^{th}$ stage of shift register unit does not output the received second clock signal CLK2 any more, and the $(n+1)^{th}$ stage of shift register unit outputs the received zeroth clock signal CLK0.

When the gate driving apparatus shown in FIG. 20 is adopted, it is presumed that the $n^{th}$ stage of shift register unit takes the third clock signal CLK3 as the received clock signal. When the gate driving apparatus performs a forward scan, the forward scan signal VF is at a high level, the reverse scan signal VB is at a low level, and the initial trigger signal STV supplies the forward selection signal CHOF to the first stage of shift register unit at the beginning of each frame. When the first clock signal CLK1 is at a high level, the first stage of shift register unit outputs a signal at a high level, that is, the signal OUT(1) is at a high level, and the OUT(1) serves as the forward selection signal CHOF for the second stage of shift register unit simultaneously. The signal OUT(n−2) outputted from the $(n-2)^{th}$ stage of shift register unit serves as the forward selection signal CHOF for the $(n-1)^{th}$ stage of shift register unit, and when the signal OUT(n−2) is at a high level, the $(n-1)^{th}$ stage of shift register unit outputs the second clock signal CLK2; the signal OUT(n−1) outputted from $(n-1)^{th}$ stage of shift register unit is the second clock signal CLK2 at this time. Since the signal OUT(n−1) outputted from the $(n-1)^{th}$ stage of shift register unit functions as the forward selection signal CHOF for the $n^{th}$ stage of shift register unit and the forward feedback signal FBF for the $(n-2)^{th}$ stage of shift register unit; that is, both the forward feedback signal FBF for the $(n-2)^{th}$ stage of shift register unit and the forward selection signal CHOF for the $n^{th}$ stage of shift register unit are the second clock signal CLK2 at this time. When the second clock signal CLK2 is at a high level, the $(n-2)^{th}$ stage of shift register unit does not output the received first clock signal CLK1 any more, and the $n^{th}$ stage of shift register unit outputs the received third clock signal CLK3, that is, the signal OUT(n) is the third clock signal CLK3 at this time. Since the signal OUT(n) outputted from $n^{th}$ stage of shift register unit functions as the forward selection signal CHOF for the $(n+1)^{th}$ stage of shift register unit and the forward feedback signal FBF for the $(n-1)^{th}$ stage of shift register unit; that is, both the forward selection signal CHOF for the $(n+1)^{th}$ stage of shift register unit and the forward feedback signal FBF for the $(n-1)^{th}$ stage of shift register unit are the third clock signal CLK3 at this time. When the third clock signal CLK3 is at a high level, the $(n-1)^{th}$ stage of shift register unit does not output the received second clock signal CLK2 any more, and the $(n+1)^{th}$ stage of shift register unit outputs the received zeroth clock signal CLK0.

Figure 22:
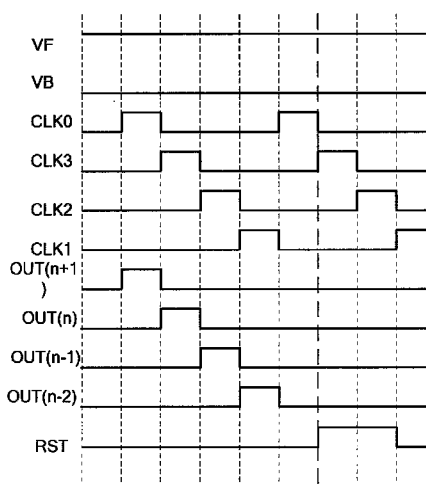
FIG. 22 is a timing diagram of the gate driving apparatus provided in the embodiments of the present disclosure in a reverse scan.

FIG. 22 is a timing diagram of the gate driving apparatus provided in the embodiments of the present disclosure in a reverse scan.

When the gate driving apparatus shown in FIG. 19 is adopted, it is presumed that the $n^{th}$ stage of shift register unit takes the third clock signal CLK3 as the received clock signal. When the gate driving apparatus performs a reverse scan, the forward scan signal VF is at a low level, the reverse scan signal VB is at a high level, and the initial trigger signal STV supplies the reverse selection signal CHOB to the $N^{th}$ stage of shift register unit at the beginning of each frame. When the mod(N/4)$^{th}$ clock signal is at a high level, the $N^{th}$ stage of shift register unit outputs a signal at a high level, that is, the signal OUT(N) is at a high level, and the OUT(N) serves as the reverse selection signal CHOB for the $(N-1)^{th}$ stage of shift register unit simultaneously. The signal OUT(n+1) outputted from the $(n+1)^{th}$ stage of shift register unit serves as the reverse selection signal CHOB for the $n^{th}$ stage of shift register unit; when the signal OUT(n+1) is at a high level, the $n^{th}$ stage of shift register unit outputs the third clock signal CLK3, that is, the signal OUT(n) outputted from the $n^{th}$ stage of shift register unit is the third clock signal CLK3 at this time. Since the signal OUT(n) outputted from the $n^{th}$ stage of shift register unit functions as the reverse selection signal CHOB for the $(n-1)^{th}$ stage of shift register unit, that is, the reverse selection signal CHOB for the $(n-1)^{th}$ stage of shift register unit is the third clock signal CLK3 at this time; when the third clock signal CLK3 is at a high level, the $(n+1)^{th}$ stage of shift register unit does not output the received zeroth clock signal CLK0 any more, and the $(n-1)^{th}$ stage of shift register unit outputs the received second clock signal CLK2, that is, the signal OUT(n−1) is the second clock signal CLK2 at this time. Since the signal OUT(n−1) outputted from the $(n-1)^{th}$ stage of shift register unit functions as the reverse selection signal CHOB for the $(n-2)^{th}$ stage of shift register unit; that is, the reverse selection signal CHOB for the $(n-2)^{th}$ stage of shift register unit is the second clock signal CLK2 at this time. When the second clock signal CLK2 is at a high level, the $n^{th}$ stage of shift register unit does not output the received third clock signal CLK3 any more, and the $(n-2)^{th}$ stage of shift register unit outputs the received first clock signal CLK1.

When the gate driving apparatus shown in FIG. 20 is adopted, it is presumed that the $n^{th}$ stage of shift register unit takes the third clock signal CLK3 as the received clock signal. When the gate driving apparatus performs a reverse scan, the forward scan signal VF is at a low level, the reverse scan signal VB is at a high level, and the initial trigger signal STV supplies the reverse selection signal CHOB to the $N^{th}$ stage of shift register unit at the beginning of each frame. When the mod(N/4)$^{th}$ clock signal is at a high level, the $N^{th}$ stage of shift register unit outputs a signal at a high level, that is, the signal OUT(N) is at the high level, and the OUT(N) serves as the reverse selection signal CHOB for the $(N-1)^{th}$ stage of shift register unit simultaneously. The signal OUT(n+1) outputted from the $(n+1)^{th}$ stage of shift register unit serves as the reverse selection signal CHOB for the $n^{th}$ stage of shift register unit, and when the signal OUT(n+1) is at a high level, the $n^{th}$ stage of shift register unit outputs the third clock signal CLK3; that is, the signal OUT(n) outputted from the $n^{th}$ stage of shift register unit is the third clock signal CLK3 at this time. Since the signal OUT(n) outputted from the $n^{th}$ stage of shift register unit functions as the reverse selection signal CHOB for the $(n-1)^{th}$ stage of shift register unit and the reverse feedback signal FBB for the $(n+1)^{th}$ stage of shift register unit; that is, both the reverse selection signal CHOB for the $(n-1)^{th}$ stage of shift register unit and the reverse feedback signal FBB for the $(n+1)^{th}$ stage of shift register unit are the third clock signal CLK3 at this time. When the third clock signal CLK3 is at a high level, the $(n+1)^{th}$ stage of shift register unit does not output the received zeroth clock signal CLK0 any more, and the $(n-1)^{th}$ stage of shift register unit outputs the received second clock signal CLK2; that is, the signal OUT(n−1) is the second clock signal CLK2 at this time. Since the signal OUT(n−1) outputted from the $(n-1)^{th}$ stage of shift register unit functions as the reverse selection signal CHOB for the $(n-2)^{th}$ stage of shift register unit and the reverse feedback signal FBB for the $n^{th}$ stage of shift register unit; that is, both the reverse selection signal CHOB for the $(n-2)^{th}$ stage of shift register unit and the reverse feedback signal FBB for the $n^{th}$ stage of shift register unit are the second clock signal CLK2 at this time. When the second clock signal CLK2 is at a high level, the $n^{th}$ stage of shift register unit does not output the received third clock signal CLK3 any more, and the $(n-2)^{th}$ stage of shift register unit outputs the received first clock signal CLK1.

In the embodiments of the present disclosure, there is further provided a display device comprising the gate driving apparatus provided in the embodiments of the present disclosure.

The sequence number of the above embodiments of the present disclosure is only for illustration, and does not represent the preference of the embodiments.

It will be obvious that those skilled in the art may make modifications and variations to the above embodiments without departing from the spirit and scope of the present disclosure. Such modifications and variations are intended to be included within the spirit and scope of the present disclosure provided that the modifications and variations belong to the scope of the claims of the present disclosure and the equivalence thereof.

What is claimed is:

1. A shift register unit comprising a driving module, a first pull-down module, a second pull-down module, a third pull-down module and an output module;
   wherein the driving module is connected to the output module, and a connection point where the driving module is connected to the output module is a pull-up node;
   the driving module is configured to control a signal at the pull-up node to be at a first level when a forward selection signal is at the first level and a forward scan signal is at the first level; is configured to control the signal at the pull-up node to be at the first level when the forward selection signal is changed from the first level to a second level and the forward scan signal is at the first level; is configured to control the signal at the pull-up node to be at the second level when the forward scan signal is at the first level and a reverse selection signal is at a first level; is configured to control the signal at the pull-up node to be at the first level when the reverse selection signal is at the first level and the reverse scan signal is at the first level; is configured to control the signal at the pull-up node to be at the first level when the reverse selection signal is changed from the first level to the second level and the reverse scan signal is at the first level; and is configured to control the signal at the pull-up node to be at the second level when the reverse scan signal is at the first level and the forward selection signal is at the first level;
   the output module is configured to output a received clock signal from an output terminal of the shift register unit when the signal at the pull-up node is at the first level, and is configured to control the output terminal of the shift register unit to stop outputting the received clock signal when the signal at the pull-up node is at the second level;
   the first pull-down module is connected to the pull-up node, the output terminal of the shift register unit, and a second level signal input terminal respectively, the first pull-down module is configured to control both the pull-up node and the output terminal of the shift register unit to be connected to the second level signal input terminal when a received pull-down signal is at the first level and the signal at the pull-up node is at the second level; and is configured to control both the pull-up node and the output terminal of the shift register unit to be disconnected from the second level signal input terminal when the signal at the pull-up node is at the first level; wherein the pull-down signal is the signal among the forward scan signal and the reverse scan signal which is at the first level, or the pull-down signal is the clock signal,
   the second pull-down module is connected to the pull-up node and the second level signal input terminal respectively, and the second pull-down module is configured to control the pull-up node to be connected to the second level signal input terminal when the reverse scan signal is at the second level and a forward feedback signal is at the first level; and is configured to control the pull-up node to be disconnected from the second level signal input terminal when the reverse scan signal is at the first level or when the reverse scan signal is at the second level and the forward feedback signal is at the second level; wherein the forward feedback signal is a signal outputted from an output terminal of another shift register unit at a stage subsequent to that of the shift register unit;
   the third pull-down module is connected to the pull-up node and the second level signal input terminal respectively, and the third pull-down module is configured to control the pull-up node to be connected to the second level signal input terminal when the forward scan signal is at the second level and a reverse feedback signal is at the first level; and is configured to control the pull-up node to be disconnected from the second level signal input terminal when the forward scan signal is at the first level or when the forward scan signal is at the second level and the reverse feedback signal is at the second level; wherein, the reverse feedback signal is a signal outputted from an output terminal of another shift register unit at a stage previous to that of the shift register unit;
   wherein the forward selection signal is a signal output from the output terminal of another shift register unit at a stage previous to that of the shift register unit, and the reverse selection signal is a signal output from the output terminal of another shift register unit subsequent to that of the shift register unit.

2. The shift register unit according to claim 1, wherein the driving module comprises a first transistor and a second transistor; wherein
   a first electrode of the first transistor is configured to receive the forward scan signal, a gate of the first transistor is configured to receive the forward selection signal, and a second electrode of the first transistor is connected to the pull-up node; a first electrode of the second transistor is configured to receive the reverse scan signal, a gate of the second transistor is configured to receive the reverse selection signal, and a second electrode of the second transistor is connected to the pull-up node;
   the first transistor is configured to be turned on when the forward selection signal is at the first level, and is configured to be turned off when the forward selection signal is at the second level; and
   the second transistor is configured to be turned on when the reverse selection signal is at the first level, and is configured to be turned off when the reverse selection signal is at the second level.

3. The shift register unit according to claim 1, wherein the output module comprises a third transistor and a first capacitor; wherein
  a first electrode of the third transistor is configured to receive the clock signal, a gate of the third transistor is connected to the pull-up node, and a second electrode of the third transistor is connected to the output terminal of the shift register unit; one terminal of the first capacitor is connected to the pull-up node, and the other terminal of the first capacitor is connected to the second electrode of the third transistor;
  the third transistor is configured to be turned on when the signal at the pull-up node is at the first level, and is configured to be turned off when the signal at the pull-up node is at the second level.

4. The shift register unit according to claim 1, wherein the first pull-down module comprises a first pull-down driving unit and a first pull-down unit;
  the first pull-down driving unit is connected to the pull-up node, the second level signal input terminal and the first pull-down unit respectively, and the first pull-down unit is connected to the pull-up node, the output terminal of the shift register unit and the second level signal input terminal;
  the first pull-down driving unit is configured to output a signal at the first level to the first pull-down unit when the received pull-down signal is at the first level and the signal at the pull-up node is at the second level; and is configured to output a signal at the second level to the first pull-down unit when the signal at the pull-up node is at the first level;
  the first pull-down unit is configured to connect the pull-up node and the output terminal of the shift register unit to the second level signal input terminal respectively when a signal at the first level outputted from the first pull-down driving unit is received; and is configured to disconnect the pull-up node and the output terminal of the shift register unit from the second level signal input terminal respectively when a signal at the second level outputted from the first pull-down driving unit is received.

5. The shift register unit according to claim 4, wherein the first pull-down unit comprises a fourth transistor and a fifth transistor;
  a first electrode of the fourth transistor is connected to the pull-up node, a gate of the fourth transistor is configured to receive the signal outputted from the first pull-down driving unit, and a second electrode of the fourth transistor is connected to the second level signal input terminal; a first electrode of the fifth transistor is connected to the output terminal of the shift register unit, a gate of the fifth transistor is configured to receive the signal outputted from the first pull-down driving unit, and a second electrode of the fifth transistor is connected to the second level signal input terminal;
  the fourth transistor is configured to be turned on when the signal at the first level outputted from the first pull-down driving unit is received, and is configured to be turned off when the signal at the second level outputted from the first pull-down driving unit is received;
  the fifth transistor is configured to be turned on when the signal at the first level outputted from the first pull-down driving unit is received, and is configured to be turned off when the signal at the second level outputted from the first pull-down driving unit is received.

6. The shift register unit according to claim 4, wherein the pull-down signal received by the first pull-down driving unit is the signal among the forward scan signal and the reverse scan signal which is at the first level; the first pull-down driving unit comprises a sixth transistor, a seventh transistor and an eighth transistor;
  a first electrode of the sixth transistor is configured to receive the forward scan signal, a gate of the sixth transistor is configured to receive the forward scan signal, and a second electrode of the sixth transistor is configured to output a signal to the first pull-down unit; a first electrode of the seventh transistor is configured to receive the reverse scan signal, a gate of the seventh transistor is configured to receive the reverse scan signal, and a second electrode of the seventh transistor is connected to the second electrode of the sixth transistor; a first electrode of the eighth transistor is connected to the second electrode of the sixth transistor, a gate of the eighth transistor is connected to the pull-up node, and a second electrode of the eighth transistor is connected to the second level signal input terminal;
  the sixth transistor is configured to be turned on when the forward scan signal is at the first level, and is configured to be turned off when the forward scan signal is at the second level;
  the seventh transistor is configured to be turned on when the reverse scan signal is at the first level, and is configured to be turned off when the reverse scan signal is at the second level; and
  the eighth transistor is configured to be turned on when the signal at the pull-up node is at the first level, and is configured to be turned off when the signal at the pull-up node is at the second level.

7. The shift register unit according to claim 4, wherein the pull-down signal received by the first pull-down driving unit is the clock signal, and the pull-down driving unit comprises a ninth transistor, a tenth transistor and an eleventh transistor;
  a first electrode of the ninth transistor is configured to receive the clock signal, a gate of the ninth transistor is configured to receive the clock signal, and a second electrode of the ninth transistor is configured to output a signal to the first pull-down unit; a first electrode of the tenth transistor is configured to receive the clock signal, a gate of the tenth transistor is connected to the second electrode of the ninth transistor, and a second electrode of the tenth transistor is connected to the second electrode of the ninth transistor; a first electrode of the eleventh transistor is connected to the second electrode of the ninth transistor, a gate of the eleventh transistor is connected to the pull-up node, and a second electrode of the eleventh transistor is connected to the second level signal input terminal;
  the eleventh transistor is configured to be turned on when the signal at the pull-up node is at the first level, and is configured to be turned off when the signal at the pull-up node is at the second level.

8. The shift register unit according to claim 1, wherein the second pull-down module comprises a twelfth transistor, a thirteenth transistor, a fourteen transistor and a fifteenth transistor;
  a first electrode of the twelfth transistor is configured to receive the forward feedback signal, a gate of the twelfth transistor is configured to receive the forward feedback signal, and a second electrode of the twelfth transistor is connected to a first electrode of the fourteenth transistor; a first electrode of the thirteenth transistor is configured to receive the forward feedback signal, a gate of the thirteenth transistor is connected to the first electrode of the fourteenth transistor, and a second electrode of the thirteenth transistor is connected to the first electrode of the fourteenth transistor; a gate of the fourteenth transistor is configured to receive the reverse scan signal, the second electrode of the fourteenth transistor is connected to the second level signal input terminal; a first electrode of the fifteenth transistor is connected to the pull-up node, a gate of the fifteenth transistor is connected to the first electrode of the fourteenth transistor, and a second electrode of the fifteenth transistor is connected to the second level signal input terminal;

the fourteenth transistor is configured to be turned on when the received reverse scan signal is at the first level, and is configured to be turned off when the received reverse scan signal is at the second level;

the fifteenth transistor is configured to be turned off when a signal at the first electrode of the fourteenth transistor is at the second level, and is configured to be turned on when the signal at the first electrode of the fourteenth transistor is at the first level.

9. The shift register unit according to claim 1, wherein the third pull-down module comprises a sixteenth transistor, a seventeenth transistor, an eighteenth transistor and a nineteenth transistor;

a first electrode of the sixteenth transistor is configured to receive the reverse feedback signal, a gate of the sixteenth transistor is configured to receive the reverse feedback signal, and a second electrode of the sixteenth transistor is connected to a first electrode of the eighteenth transistor; a first electrode of the seventeenth transistor is configured to receive the reverse feedback signal, a gate of the seventeenth transistor is connected to the first electrode of the eighteenth transistor, and a second electrode of the seventeenth transistor is connected to the first electrode of the eighteenth transistor; a gate of the eighteenth transistor is configured to receive the forward scan signal, the second electrode of the eighteenth transistor is connected to the second level signal input terminal; a first electrode of the nineteenth transistor is connected to the pull-up node, a gate of the nineteenth transistor is connected to the first electrode of the eighteenth transistor, and a second electrode of the nineteenth transistor is connected to the second level signal input terminal;

the eighteenth transistor is configured to be turned on when the received forward scan signal is at the first level, and is configured to be turned off when the received forward scan signal is at the second level; and the nineteenth transistor is configured to be turned off when a signal at the first electrode of the eighteenth transistor is at the second level, and is configured to be turned on when the signal at the first electrode of the eighteenth transistor is at the first level.

10. The shift register unit according to claim 1, further comprising a reset module connected to the output terminal of the shift register unit and the second level signal input terminal respectively; wherein the reset module is configured to connect the output terminal of the shift register unit to the second level signal input terminal when a received reset signal is at the first level, and is configured to disconnect the output terminal of the shift register unit from the second level signal input terminal when the received reset signal is at the second level.

11. The shift register unit according to claim 10, wherein the reset module comprises a twentieth transistor;

a first electrode of the twentieth transistor is connected to the output terminal of the shift register unit, a gate of twentieth transistor is configured to receive the reset signal, and a second electrode of twentieth transistor is connected to the second level signal input terminal;

the twentieth transistor is configured to be turned on when the received reset signal is at the first level, and is configured to be turned off when the received reset signal is at the second level.

12. A gate driving apparatus comprising (N+2) stages of shift register units according to claim 1, wherein a $n^{th}$ stage of shift register unit is configured to take a $mod(n/4)^{th}$ clock signal as a received clock signal, n=0, 1, ..., N, N+1, and N is a positive integer;

except for a zeroth stage of shift register unit and a $(N+1)^{th}$ stage of shift register unit, each stage of shift register unit is configured to receive a signal outputted from its previous stage of shift register unit as a forward selection signal, and is configured to receive a signal outputted from its subsequent stage of shift register unit as a reverse selection signal;

the zeroth stage of shift register unit is configured to receive an initial trigger signal as a forward selection signal, and is configured to receive a signal outputted from a first stage of shift register unit as a reverse selection signal;

the $(N+1)^{th}$ stage of shift register unit is configured to receive the initial trigger signal as a reverse selection signal, and is configured to receive a signal outputted from a $N^{th}$ stage of shift register unit as a forward selection signal.

13. The gate driving apparatus according to claim 12, wherein the first pull-down module comprises a first pull-down driving unit and a first pull-down unit;

the first pull-down driving unit is connected to the pull-up node, the second level signal input terminal and the first pull-down unit respectively, and the first pull-down unit is connected to the pull-up node, the output terminal of the shift register unit and the second level signal input terminal;

the first pull-down driving unit is configured to output a signal at the first level to the first pull-down unit when the received pull-down signal is at the first level and the signal at the pull-up node is at the second level; and is configured to output a signal at the second level to the first pull-down unit when the signal at the pull-up node is at the first level;

the first pull-down unit is configured to connect the pull-up node and the output terminal of the shift register unit to the second level signal input terminal respectively when a signal at the first level outputted from the first pull-down driving unit is received; and is configured to disconnect the pull-up node and the output terminal of the shift register unit from the second level signal input terminal respectively when a signal at the second level outputted from the first pull-down driving unit is received.

14. The gate driving apparatus according to claim 12, wherein the shift register unit further comprises a reset module connected to the output terminal of the shift register unit and the second level signal input terminal respectively; wherein the reset module is configured to connect the output terminal of the shift register unit to the second level signal input terminal when a received reset signal is at the first level, and is configured to disconnect the output terminal of the shift register unit from the second level signal input terminal when the received reset signal is at the second level.

15. A gate driving apparatus comprising (N+2) stages of shift register units according to claim 1, wherein a $n^{th}$ stage of shift register unit is configured to take a mod(n/4)$^{th}$ clock signal as a received clock signal, n=0, 1, . . . , N, N+1, and N is a positive integer;

except for a zeroth stage of shift register unit, a first stage of shift register unit, a $N^{th}$ stage of shift register unit and a $(N+1)^{th}$ stage of shift register unit, each stage of shift register unit is configured to receive a signal outputted from its previous stage of shift register unit as a forward selection signal and a reverse feedback signal, and is configured to receive a signal outputted from its subsequent stage of shift register unit as a reverse selection signal and a forward feedback signal;

the first stage of shift register unit is configured to receive an initial trigger signal as a forward selection signal, to receive a signal outputted from the zeroth stage of shift register unit as a reverse feedback signal, and to receive a signal outputted from the second stage of shift register unit as a reverse selection signal and a forward feedback signal;

the $N^{th}$ stage of shift register unit is configured to receive the initial trigger signal as a reverse selection signal, to receive a signal outputted from the $(N+1)^{th}$ stage of shift register unit as a forward feedback signal, and to receive a signal outputted from a $(N-1)^{th}$ stage of shift register unit as a forward selection signal and a reverse feedback signal;

the zeroth stage of shift register unit is configured to receive a signal outputted from the first stage of shift register unit as a reverse selection signal; and the $(N+1)^{th}$ stage of shift register unit is configured to receive a signal outputted from the $N^{th}$ stage of shift register unit as a forward selection signal.

16. The gate driving apparatus according to claim 15, wherein the shift register unit further comprises a reset module connected to the output terminal of the shift register unit and the second level signal input terminal respectively; wherein the reset module is configured to connect the output terminal of the shift register unit to the second level signal input terminal when a received reset signal is at the first level, and is configured to disconnect the output terminal of the shift register unit from the second level signal input terminal when the received reset signal is at the second level.

* * * * *